(12) United States Patent
Yamanaka et al.

(10) Patent No.: US 7,872,471 B2
(45) Date of Patent: Jan. 18, 2011

(54) TESTING METHOD OF HEAD ELEMENT AND MAGNETIC RECORDING AND REPRODUCING APPARATUS CAPABLE OF HEAD EVALUATING

(75) Inventors: Noboru Yamanaka, Tokyo (JP); Soji Koide, Tokyo (JP); Yoshiyuki Mizoguchi, Tokyo (JP); Eric Cheuk Wing Leung, Hong Kong (CN); Chris Chiu Ming Leung, Hong Kong (CN); Leo Wai Kay Lau, Hong Kong (CN); Charles Kin Chiu Wong, Hong Kong (CN)

(73) Assignees: TDK Corporation, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 712 days.

(21) Appl. No.: 11/835,049

(22) Filed: Aug. 7, 2007

(65) Prior Publication Data

US 2008/0049351 A1     Feb. 28, 2008

(30) Foreign Application Priority Data

Aug. 24, 2006   (JP)   ............................. 2006-227847

(51) Int. Cl.
*G01R 33/12*   (2006.01)
*G01R 33/09*   (2006.01)

(52) U.S. Cl. ...................................... 324/210; 324/252

(58) Field of Classification Search ......... 324/210–213, 324/207.21, 252; 360/313–318, 324–327
See application file for complete search history.

(56) References Cited

U.S. PATENT DOCUMENTS 5,991,113 A    11/1999   Meyer et al.

FOREIGN PATENT DOCUMENTS

JP     A 06-084116     3/1994
JP     A 2002-133621   5/2002

OTHER PUBLICATIONS

Uesugi, Takumi et al., U.S. Appl. No. 11/753,836, filed May 25, 2007.

*Primary Examiner*—Bot L LeDynh
(74) *Attorney, Agent, or Firm*—Oliff & Berridge, PLC

(57) ABSTRACT

Provided is a method for testing a head element that enables proper evaluation of the head element based on a characteristic of the head element under high-temperature and high-stress conditions. The testing method can be performed on a thin-film magnetic head including a head element and a heating element capable of applying a heat and stress to the head element, or performed on a row bar or a substrate wafer on which a plurality of the head elements and a plurality of the heating elements are disposed. The testing method comprises the steps of: causing the heating element to generate heat to apply a heat and stress to the head element; and measuring a characteristic of the head element under the heat and stress to evaluate the head element.

11 Claims, 14 Drawing Sheets

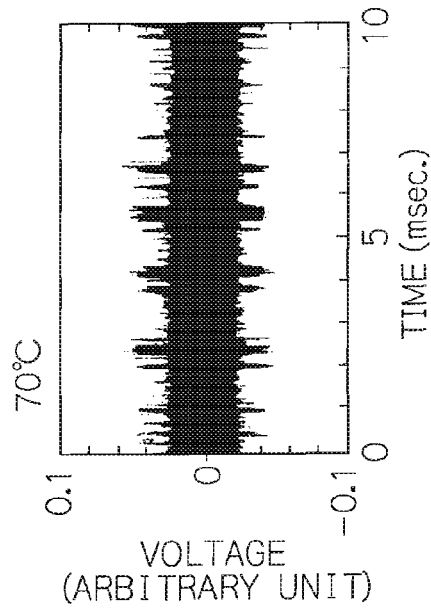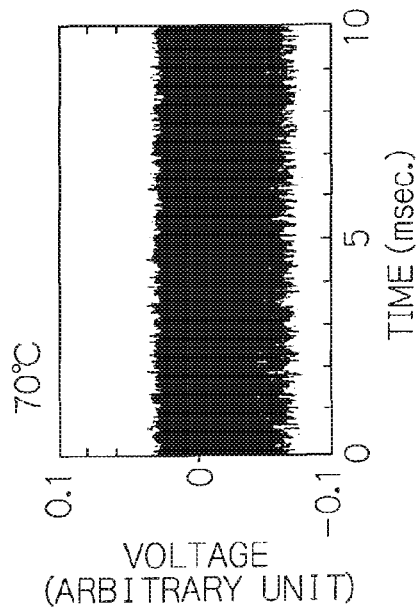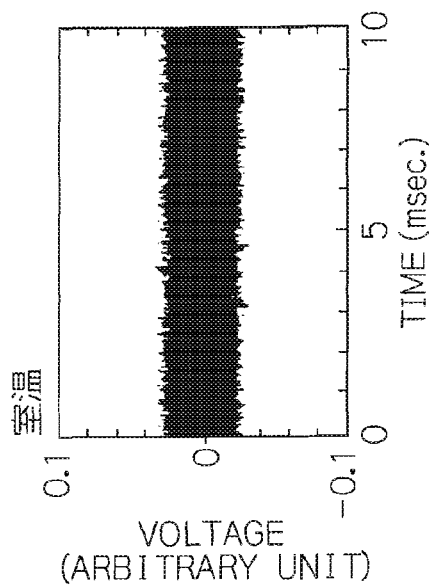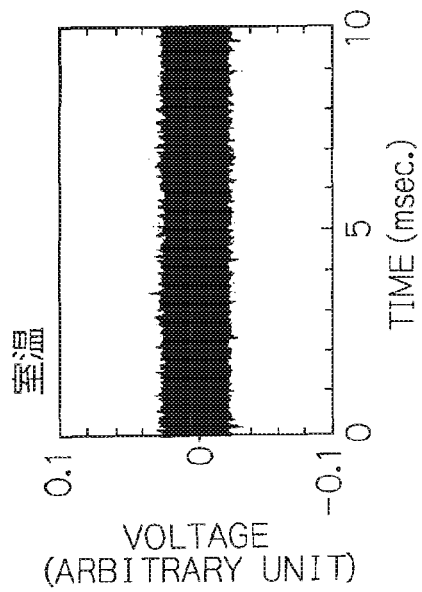
Fig. 4a1   Fig. 4a2   Fig. 4b1   Fig. 4b2

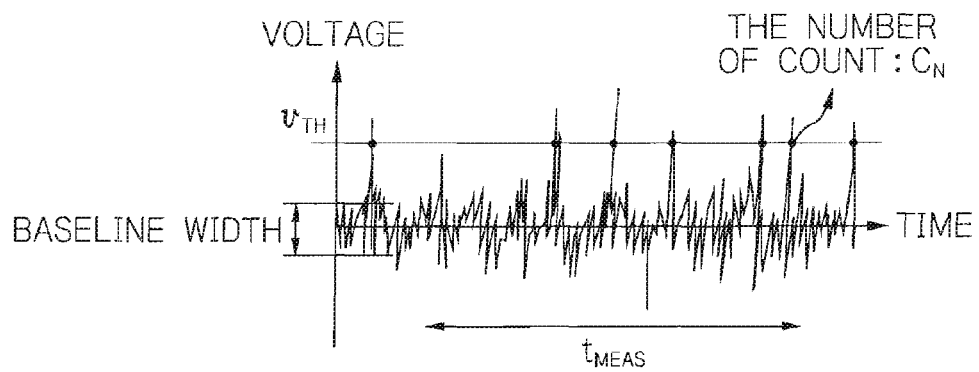
*Fig. 5a*
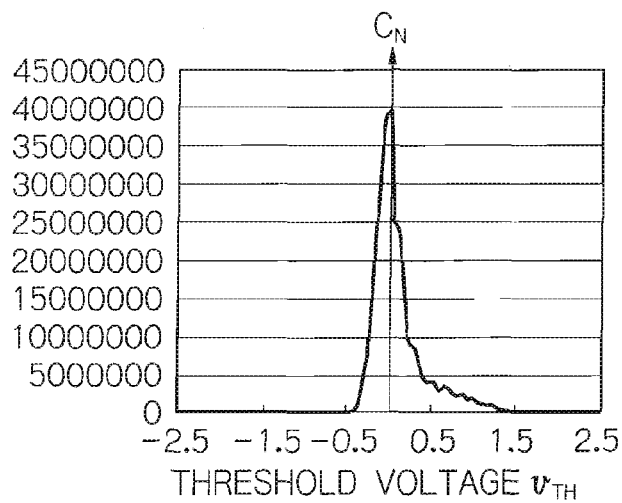
*Fig. 5b*
*Fig. 5c*
THE NUMBER OF NORMALIZED
NOISE COUNT : $nC_N = \log_{10}\left(\dfrac{C_N}{MAX(C_N)}\right) \times 100(\%)$
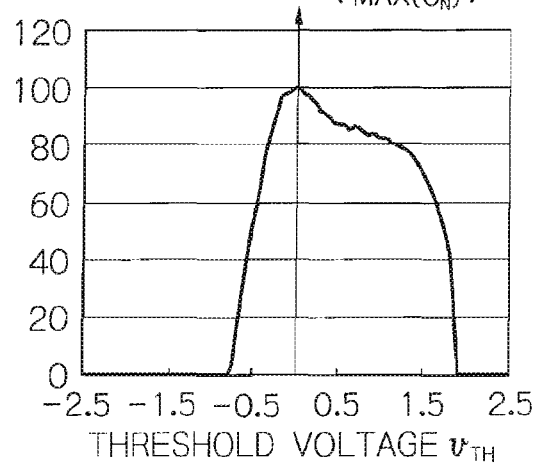

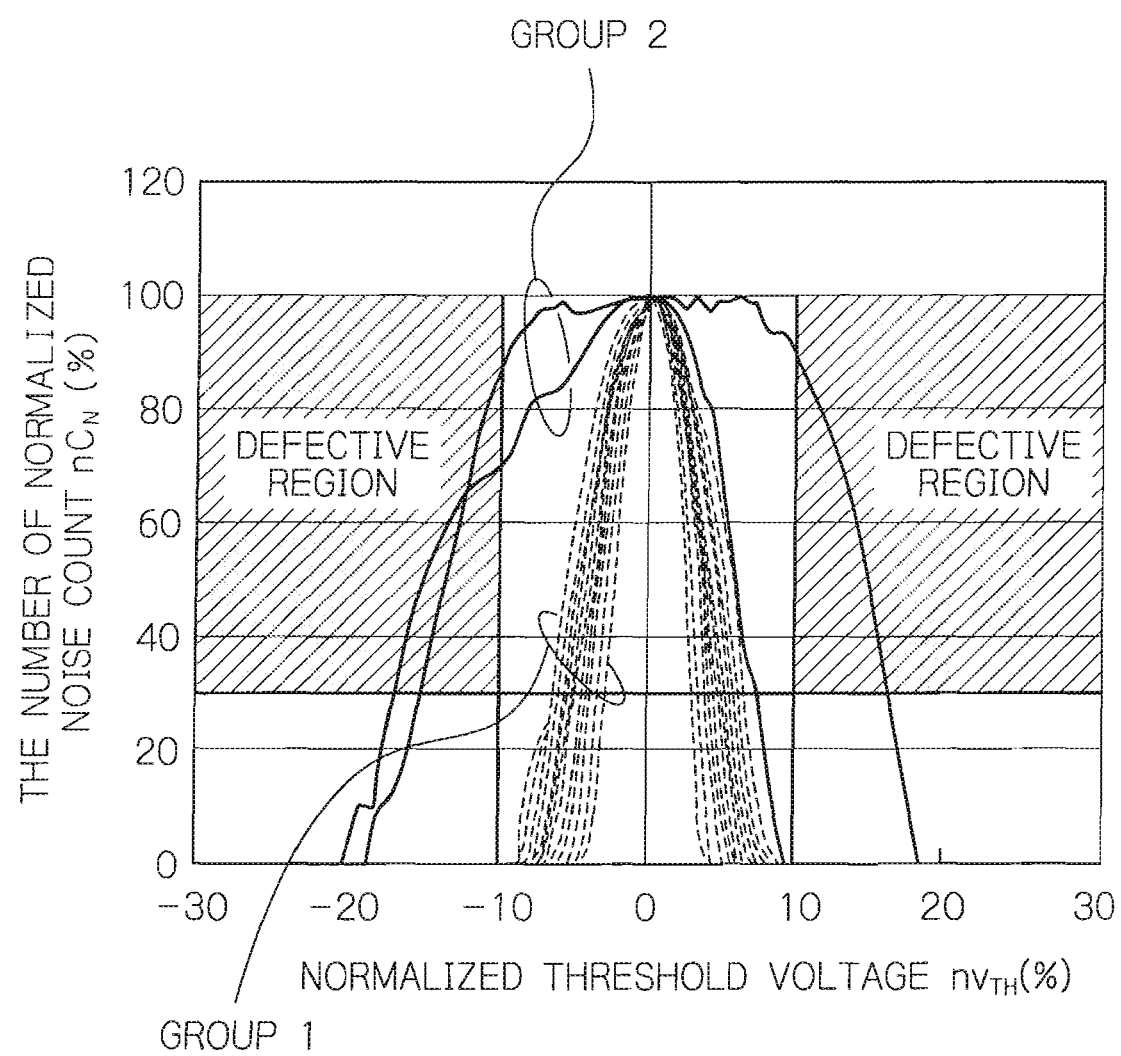

TESTING METHOD OF HEAD ELEMENT AND MAGNETIC RECORDING AND REPRODUCING APPARATUS CAPABLE OF HEAD EVALUATING

PRIORITY CLAIM

This application claims priority from Japanese patent application No. 2006-227847, filed on Aug. 24, 2006, which is incorporated herein by reference.

BACKGROUND OF THE INVENTION

1. Field of the Invention

The present invention relates to a method for testing a head element of a thin-film magnetic head and a method for manufacturing a thin-film magnetic head and a head gimbal assembly (HGA), using the testing method. The present invention also relates to a magnetic recording and reproducing apparatus capable of evaluating a thin-film magnetic head.

2. Description of the Related Art

Most of the thin-film magnetic heads currently provided in magnetic recording and reproducing apparatuses such as magnetic disk drive apparatuses and magnetic tape drive apparatuses use a highly sensitive magnetoresistive (MR) effect element having an output that does not depend on the relative velocity to a magnetic recording medium to read data signals from a magnetic recording medium such as a magnetic disk or a magnetic tape.

A problem with such conventional MR effect elements is that defective products that generate Barkhausen noise in their outputs are produced. The Barkhausen noise is generated primarily because a magnetic domain wall is caught in defects in the magnetic film constituting the MR effect element as the magnetic domain wall moves, and is affected substantially by stress applied to the MR effect element. In practice, when an external or internal stress that exceeds a certain amount is applied, inverse magnetostriction disperses the magnetization in the MR effect element to destabilize the structure of the magnetic domains, making it more likely to cause Barkhausen noise. Such a stress can be caused by a distortion of the structure of the element itself as well as increase of deformation by the thermal expansion associated with an increase in the temperature of the element.

The influence of temperature and stress has become more remarkable than ever before especially in recent current-in-plane (CIP) giant magnetoresistive (GMR) effect elements, current-perpendicular-to-plane (CPP) GMR effect elements, or tunnel magnetoresistive (TMR) effect elements, which sense signal magnetic fields with extremely high sensitivities.

Furthermore, in order to stably control the flying height of a thin-film magnetic head, which is set to an ultra-small value in a recent magnetic disk drive apparatus, a technique has come into adoption in which a heating element is provided within a thin-film magnetic head and the end of the head element is caused to be protruded in the direction of the magnetic disk by the heat generated by the heating element to adjust the flying height (see, for example, U.S. Pat. No. 5,991, 113). With this technique, thermal asperities and crashes are avoided to maintain good read and write characteristics. However, heat generated by such a heating element further heats the MR effect element and portions around the MR effect element, and can further increase the influence of the temperature and stress.

Approaches to preventing the Barkhausen noise in MR effect elements have been proposed. For example, Japanese Patent Publication No. 2002-133621A proposes a method for determining whether an MR effect element is acceptable or defective by measuring noise generated in response to various values of sense currents flowing through an MR effect element. Japanese Patent Publication No. 06-84116A discloses a technique that gradually increases a sense current passed through an MR effect head to prevent the formation of a magnetic domain structure that is likely to generate noise due to a stress caused by a rapid change in temperature.

However, it has been very difficult to identify heads having the noise problem beforehand with the related art described above.

In practice, it is difficult to prevent stress that can cause noise for reasons of thin-film magnetic head manufacturing technique. Therefore, testing of thin-film magnetic heads must be performed to determine whether a thin-film magnetic head is acceptable or not with respect to noise being output from an MR effect element. Even if a head was tested by using a sense current to cause an MR effect element itself to generate heat to induce thermal stress as in the techniques disclosed in Japanese Patent Publications Nos. 2002-133621A and 06-84116A and was determined as non-defective heads, the head has sometimes caused Barkhausen noise under actual high-temperature conditions.

Furthermore, increasing the sense current value in order to test a head can cause an irreversible change in the MR effect element and make the testing a destructive test. This causes a serious problem especially in the case of a TMR effect element including a tunnel barrier layer, which is an ultra-thin insulating film.

BRIEF SUMMARY OF THE INVENTION

Therefore an object of the present invention is to provide a method for testing a head element that enables proper evaluation of the head element based on a characteristic of the head element under high-temperature and high-stress conditions.

Another object of the present invention is to provide a method for manufacturing a thin-film magnetic head and an HGA, using the evaluation method. Yet another object of the present invention is to provide a magnetic recording and reproducing apparatus capable of properly evaluating conditions of a thin-film magnetic head on the basis of a characteristic of the head element under high-temperature and high-stress conditions.

Before describing the present invention, terms used herein will be defined. In a multilayer structure of an element formed on the element formation surface of a substrate, a component located closer to the substrate than a layer is referred to as being located "under" or "below" that layer, and a component that is located on the stacking direction side of a layer is referred to as being located "on" or "above" that layer. For example, "a lower magnetic pole layer is located on an insulating layer" means that the lower magnetic pole layer is located on the stacking direction side of the insulating layer.

According to the present invention, provided is a testing method of a head element, performed on a thin-film magnetic head including a head element and a heating element capable of applying a heat and stress to the head element, or performed on a row bar or a substrate wafer on which a plurality of the head elements and a plurality of the heating elements are disposed, which comprises the steps of: causing the heating element to generate heat to apply a heat and stress to the head element; and measuring a characteristic of the head element under the heat and stress to evaluate the head element.

In this testing method, the head element can be properly evaluated on the basis of a characteristic of the head element, such as the error rate or the level of noise in the output of the head element, under a high temperature and large stress by using the heating element included in the thin-film magnetic head. As a result, whether the head element or the thin-film magnetic head is defective or not can be properly determined.

Further, this testing method utilizes the heating element included in the thin-film magnetic head. Therefore, the temperature of the head element, which is one of the important testing conditions, can be arbitrarily set and appropriately controlled by adjusting the total electric power applied to the heating element.

In the testing method according to the present invention, the head element is preferably a MR effect element for reading data signals from a magnetic recording medium, and the MR effect element is preferably evaluated by causing the heating element to generate heat to apply the heat and stress to the MR effect element and by measuring an error rate or a level of noise in an output of the MR effect element under the heat and stress. In this case, it is also preferable that, when a count of noise that is measured in an output of the MR effect element and has a voltage exceeding a predetermined threshold exceeds a predetermined threshold, the MR effect element is determined as a defective one.

Further as the specific case, it is also preferable that, when a normalized noise count value $nC_N$ exceeds 30% while the absolute value of a normalized threshold voltage $nv_{TH}$ exceeds 10% in a noise count profile of an output of the MR effect element, the MR effect element is determined as a defective one. Here, the normalized noise count value $nC_N$ and the normalized threshold voltage $nv_{TH}$ are considered in a noise count profile (NCP) of the output of the MR effect element. That is, the above-described testing method uses predetermined regions in the graph of NCP as described in detail later for the evaluation of the level of noise. Therefore, the pass/fail criteria can be flexibly and readily set and adjusted. Further, by using multiple regions, stepwise pass/fail determination can also be readily performed.

Further, in the testing method according to the present invention, the evaluation is preferably performed on the thin-film magnetic head independently or incorporated in an HGA, under the condition that the thin-film magnetic head is positioned at a distance from a signal magnetic field of a magnetic recording medium. Furthermore, the evaluation is preferably performed while an external magnetic field is being applied to the thin-film magnetic head.

Further, in the testing method according to the present invention, the heating element preferably functions as a flying-height adjusting element as well for adjusting the flying height of the thin-film magnetic head by causing an end on an air bearing surface (ABS) side of the head element to protrude due to thermal expansion. In this case, the above-described testing method can be performed by using the heating element as a flying-height adjusting element, without a heating element newly-provided.

According to the present invention, further provided is a computer program product for testing and evaluation of a head element, performed on a thin-film magnetic head including the head element and a heating element capable of applying a heat and stress to the head element, or performed on a row bar or a substrate wafer on which a plurality of the head elements and a plurality of the heating elements are disposed, which comprises: computer code for causing the heating element to generate heat to apply a heat and stress to the head element; and computer code for measuring a characteristic of the head element under the heat and stress to evaluate the head element.

In the computer program product according to the present invention, it is preferable that the head element is a MR effect element for reading data signals from a magnetic recording medium, and the computer program product comprises: computer code for causing the heating element to generate heat to apply the heat and stress to the MR effect element; and computer code for measuring an error rate or a level of noise in an output of the MR effect element under the heat and stress.

Further, in this case, the computer program product also preferably comprises computer code for determining the MR effect element as a defective one, when a count of noise that is measured in an output of the MR effect element and has a voltage exceeding a predetermined threshold exceeds a predetermined threshold. Furthermore, the computer program product also preferably comprises computer code for determining the MR effect element as a defective one, when a normalized noise count value $nC_N$ exceeds 30% while the absolute value of a normalized threshold voltage $nv_{TH}$ exceeds 10% in a noise count profile of an output of the MR effect element.

According to the present invention, a manufacturing method of a thin-film magnetic head is further provided, which comprises the steps of:

forming a plurality of head elements and a plurality of heating elements on an element formation surface of a substrate wafer;

cutting the substrate wafer on which the plurality of head elements and the plurality of heating elements are formed into row bars on which a plurality of the head elements and a plurality of the heating elements are aligned;

performing testing and evaluation of each of the head elements formed on the row bar by using the above described testing method; and selecting a head element determined as a non-defective one as a result of the testing, and cutting the row bar into sliders to obtain a thin-film magnetic head including the non-defective head element.

According to the present invention, a manufacturing method of an HGA is further provided, which comprises the steps of:

performing testing and evaluation of a head element included in a thin-film magnetic head provided with a heating element capable of applying a heat and stress to the head element by using the above described testing method; and attaching only a thin-film magnetic head that includes a head element determined as a non-defective one as a result of the testing to a suspension.

By using these manufacturing methods, the characteristic of the head element under a high temperature and large stress can be evaluated. Therefore, the determination as to whether the head elements or thin-film magnetic heads are acceptable or not can be properly made and the manufacturing yield of thin-film magnetic heads or HGAs can be improved.

According to the present invention, a magnetic recording and reproducing apparatus is further provided, which comprises:

at least one magnetic recording medium;

at least one HGA comprising a thin-film magnetic head provided on an end portion of the HGA, the thin-film magnetic head comprising: a MR effect element for reading data signals from the magnetic recording medium; and a heating element capable of applying a heat and stress to the MR effect element;

heating-element control means capable of supplying electric power to the heating element to control the amount of heat and the intensity of stress applied to the MR effect element;

error/noise measuring means for measuring an error rate or a noise in an output of the MR effect element; and control means for controlling and causing the heating-element control means and the error/noise measuring means to operate in conjunction with each other in order to measure an error rate or a noise in an output of the MR effect element under predetermined heat and stress applied by the heating element.

In this magnetic recording and reproducing apparatus, the testing of the thin-film magnetic head having an MR effect element under a high temperature and large stress conditions, which was very difficult in the past, can be conducted as appropriate. As a result, an abnormality in the magnetic recording and reproducing apparatus can be predicted.

In the magnetic recording and reproducing apparatus according to the present invention, the magnetic recording and reproducing apparatus preferably further comprises head evaluating means for evaluating a condition of the thin-film magnetic head on the basis of the error rate or the noise level measured by the error/noise measuring means. Furthermore, the head evaluating means preferably determines that the condition of the thin-film magnetic head is defective if the error rate or the noise level exceeds a predetermined threshold.

In the magnetic recording and reproducing apparatus according to the present invention, the magnetic recording and reproducing apparatus preferably further comprises head condition indicating means for indicating the condition of the thin-film magnetic head evaluated by the head evaluating means.

Furthermore, it is preferable that the heating element also functions as a flying-height adjusting element for adjusting a flying height of the thin-film magnetic head by causing, due to thermal expansion, an end on an ABS side of the MR effect element to protrude.

According to the present invention, a head element testing apparatus for testing and evaluation of a MR effect element included in a thin-film magnetic head comprising a heating element capable of applying a heat and stress to the MR effect element, which comprises:

heating control means for supplying electric power to the MR effect element and controlling the heat and stress applied by the heating element to the MR effect element;

constant current means for applying a predetermined amount of sense current to the MR effect element;

an amplifier for amplifying an output from the MR effect element;

an A/D converter 504 for converting the amplified output that is analog into a digital signal; and a digital computer for taking in the digital signal from the A/D converter, measuring a level of noise in the output from the MR effect element to determine whether a thin-film magnetic head is acceptable or not, and controlling operation of the heating control means and the constant current means.

In the head element testing apparatus according to the present invention, the head element testing apparatus preferably further comprises a temperature element for monitoring a temperature rise caused by heat from the heating element. And it is also preferable that the head element testing apparatus further comprises a magnetic field control means and at least one Helmholtz coil for applying an external magnetic field to the thin-film magnetic head in order to measure a level of noise under a given magnetic field.

Further objects and advantages of the present invention will be apparent from the following description of preferred embodiments of the invention as illustrated in the accompanying drawings.

BRIEF DESCRIPTION OF THE SEVERAL VIEWS OF THE DRAWINGS

FIGS. 4a1 to 4b2 show graphs illustrating examples of noise generated in the output from the MR effect element;

FIGS. 5a to 5c show graphs for explaining a noise count profile (NCP) for evaluating the level of noise;

FIG. 7 shows a graph illustrating a practical example of the present invention in which a thin-film magnetic head is evaluated on the basis of an NCP;

FIG. 8b shows a perspective view including the cross-section of FIG. 8a.

DETAILED DESCRIPTION OF THE INVENTION

Figure 1:
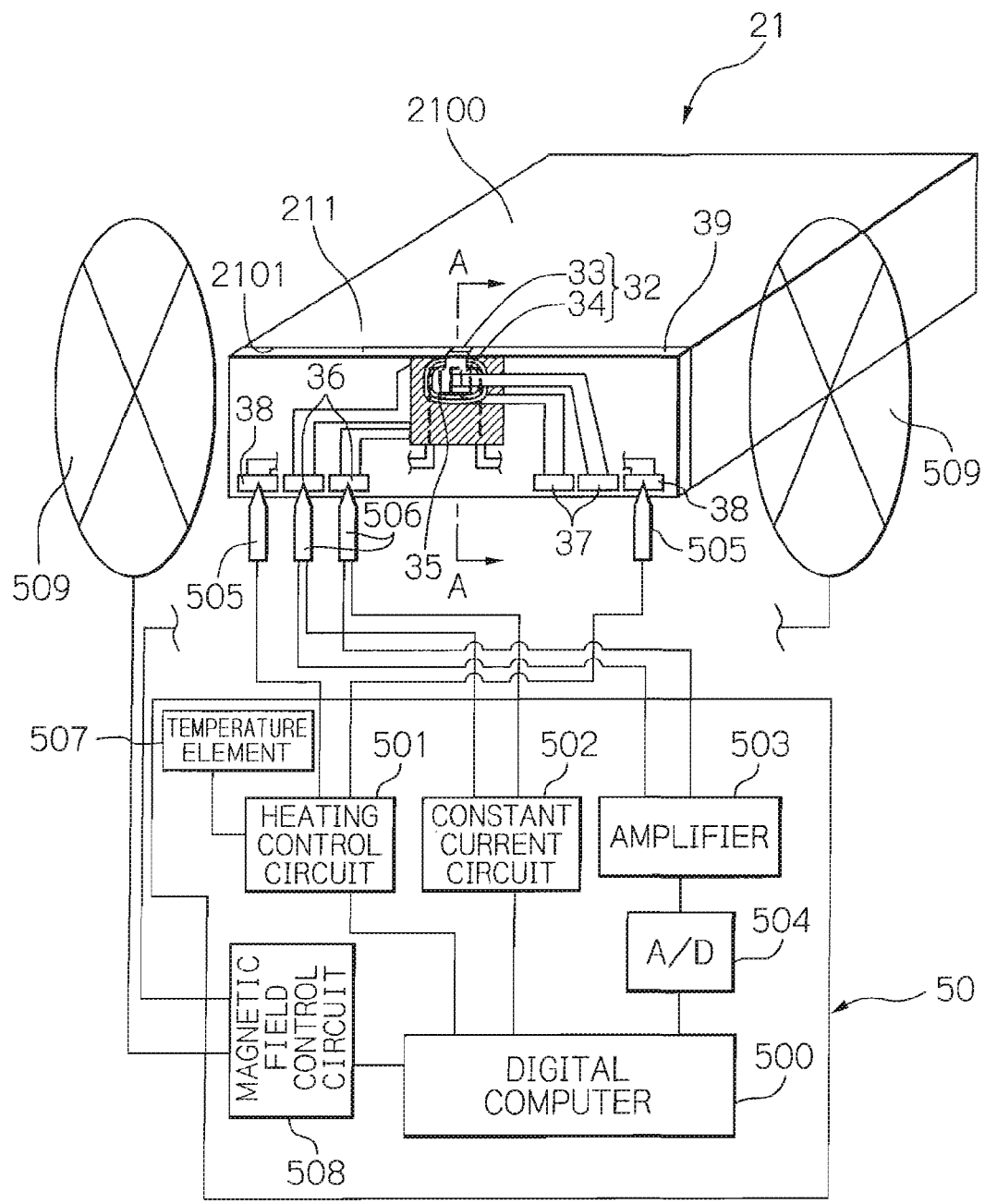
FIG. 1 shows a perspective view illustrating a thin-film magnetic head and a testing apparatus used for performing a head-element testing method according to the present invention.

FIG. 1 shows a perspective view illustrating a thin-film magnetic head and a testing apparatus used for performing a head-element testing method according to the present invention.

Referring to FIG. 1, the thin-film magnetic head 21 includes: an air bearing surface (ABS) 2100 processed so as to provide an appropriate flying height; a magnetic head element 32 provided on an element formation surface 2101; a heating element 35 also provided on the element formation surface 2101 for applying heat and stress to the magnetic head element 32; an overcoat layer 39 provided on the element formation surface 2101 so as to cover the magnetic head element 32; and pairs of signal electrodes 36 and 37 exposed in the surface of the overcoat layer 39, and two drive electrodes 38. The magnetic head element 32 includes an MR effect element 33 which is a read head element 33 for reading data signals and an electromagnetic coil element 34 which is a write head element for writing data signals. The signal electrodes 36 and 37 are connected to the MR effect element 33 and the electromagnetic coil element 34, respectively. The drive electrodes 38 are connected to the heating element 35.

One end of each of the MR effect element 33 and the electromagnetic coil element 34 reaches a slider end surface 211. The slider end surface 211 is a surface other than the ABS 2100 in the surface of the thin-film magnetic head 21 that faces a magnetic disk and is mainly composed of the end surface of the overcoat layer 39. One end of each of these elements faces a magnetic disk to sense signal magnetic fields to read data signals and to apply signal magnetic fields to write data signals.

The heating element 35, which is provided between the MR effect element 33 and the electromagnetic coil element 34 in FIG. 1, is an element used for performing the head-element testing method according to the present invention. The heating element 35 generates heat when electric current is passed through it. A large internal stress is generated in the MR effect element 33 due to the thermal expansion of the MR effect element 33 caused by heat generated by the heating element 35 and the thermal expansion of the material surrounding the MR effect element 33, in addition to internal distortion inherent in the MR effect element 33. The level of noise such as Barkhausen noise that occurs in an output of the MR effect element 33 is measured under these conditions to identify whether or not the thin-film magnetic head has a potential distortion that can cause noise under high-temperature conditions.

The heating element 35 may also function as a flying-height adjusting element for adjusting the flying height of the thin-film magnetic head 21 from a magnetic disk 10. In that case, when the heating element 35 generates heat by an electric current applied to it, the magnetic head element 32 thermally expands due to the heat from the heating element 35 or is pushed by the thermal expansion of the material surrounding the magnetic head element 32 to protrude toward the disk surface in such a manner that the slider end surface 211 is heaved. The protrusion can be adjusted by controlling the amount of current passed through the heating element 35 to adjust the flying height.

The two drive electrodes 38 connected to the heating element 35 are disposed on both sides of the group of the four signal electrodes 36 and 37. This disposition can prevent crosstalk between the wiring of the MR effect element 33 and the wiring of the electromagnetic coil element 34 as described in Japanese Patent Publication No. 2004-234792A. However, if a certain amount of crosstalk is permissible, each of the two drive electrodes 38 may be disposed between any of the four signal electrodes 36 and 37. The numbers of these electrodes is not limited to those given in the embodiment shown in FIG. 1. While the six electrodes are shown in FIG. 1, only one drive electrode, that is, the five electrodes in total may be provided, and the ground is connected to the slider substrate.

Also referring to FIG. 1, the head element testing apparatus 50 includes: a heating control circuit 501 for supplying electric power to the heating element 35 and controlling heat and stress applied by the heating element 35 to the MR effect element 33; a constant current circuit 502 for applying a predetermined amount of sense current to an MR effect multilayer which is a magnetosensitive section of the MR effect element 33; an amplifier 503 for amplifying an output from the MR effect element 33; an A/D converter 504 for converting the amplified analog output into a digital signal; and a digital computer 500 which takes in the digital signal from the A/D converter 504, measures the level of noise in the output from the MR effect element 33 to determine whether a thin-film magnetic head is acceptable or not, and controls operation of the heating control circuit 501 and the constant current circuit 502.

A pair of probes 505 is electrically connected to the heating control circuit 501 and is capable of being brought into contact with the two drive electrodes 38 in order to supply electric power to the heating element 35. Another pair of probes 506 is electrically connected to the constant current circuit 502 and the amplifier 503 and is capable of being brought into contact with the two signal electrodes 36 in order to apply a sense current to the MR effect element 33 and to transmit an output from the MR effect element 33 to the amplifier 503.

The head element testing apparatus 50 may further include a temperature element 507 which monitors a temperature rise caused by heat from the heating element 35 in order to properly control heating operation of the heating element 35. The head element testing apparatus 50 may further include a magnetic field control circuit 508 and a Helmholtz coil 509 for applying an external magnetic field to the thin-film magnetic head 21 in order to measure the level of noise under a given magnetic field. Instead of these magnetic field applying means, a permanent magnet, not shown, may be provided for applying a predetermined external magnetic field.

Figure 2:
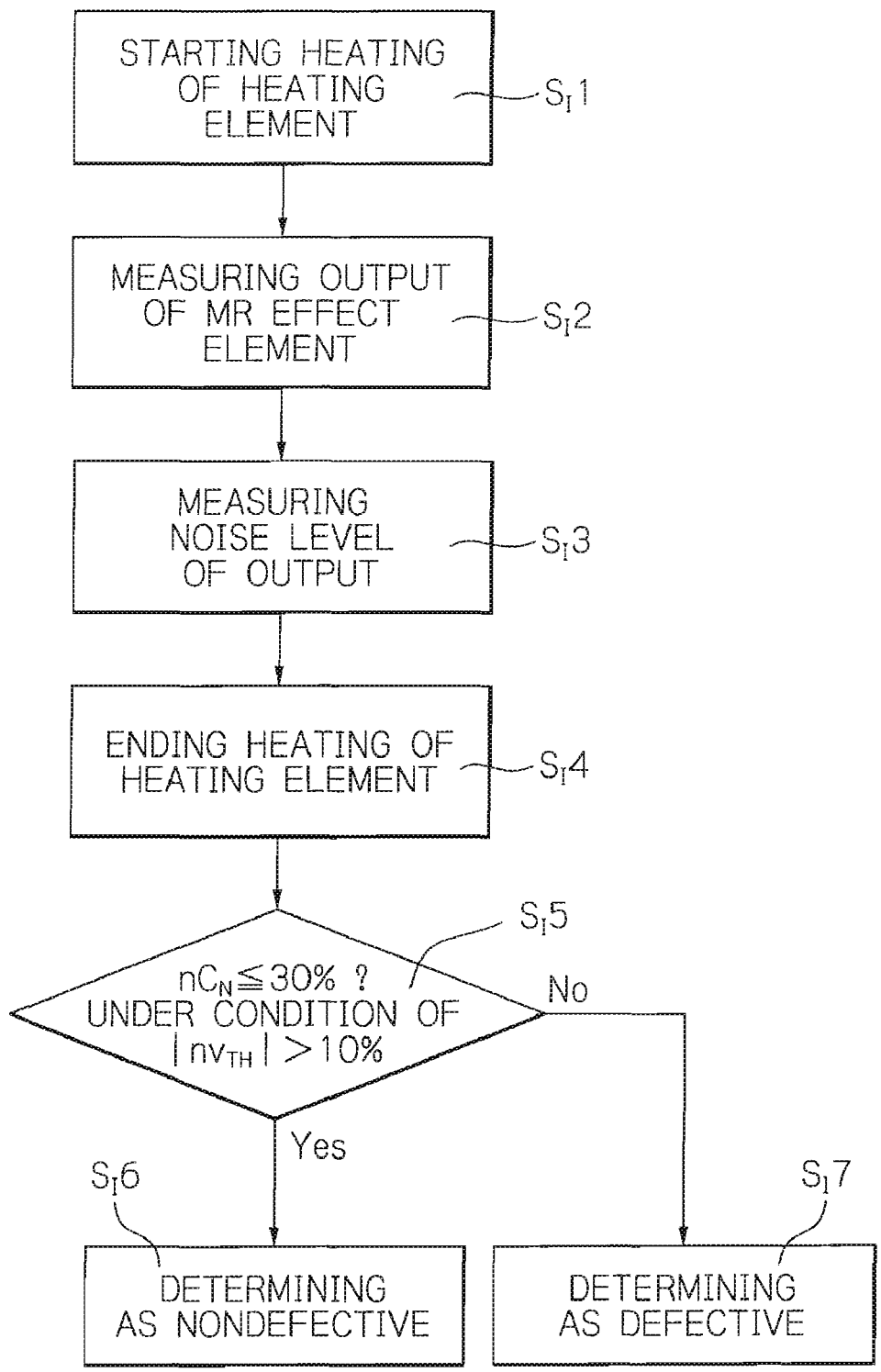
FIG. 2 shows a flowchart illustrating one embodiment of the head-element testing method according to the present invention.

FIG. 2 shows a flowchart illustrating one embodiment of the head-element testing method according to the present invention. The testing method will be described below with reference to the flowchart shown. Elaboration will be provided with reference to FIGS. 3a and 3b to FIGS. 6a and 6b as needed and practical examples will also be described.

Figure 3A:
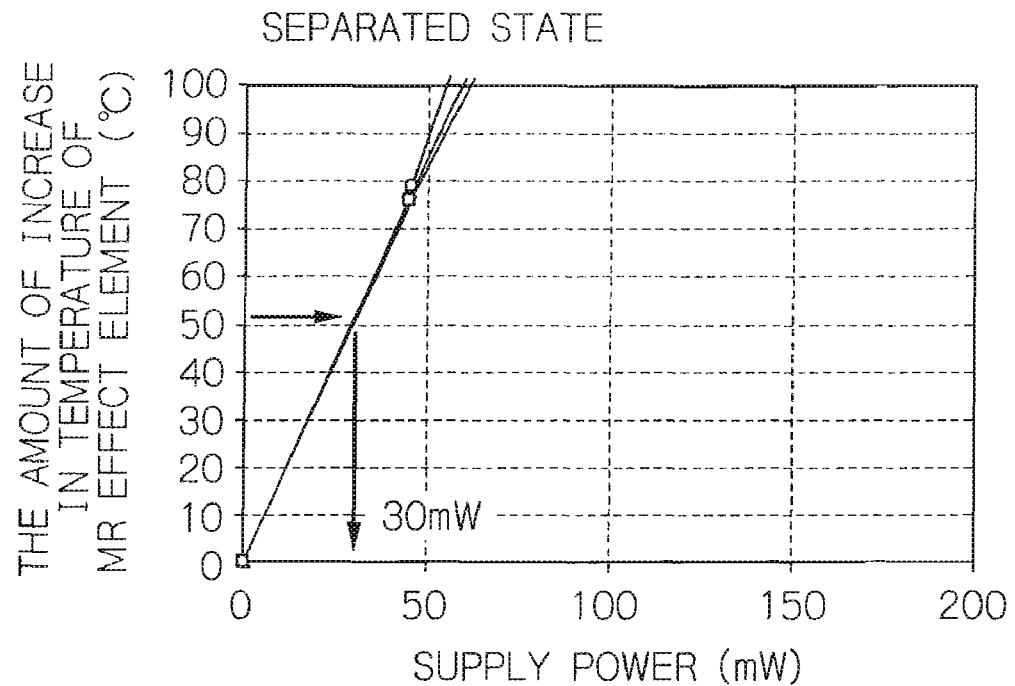
FIGS. 3a and 3b show graphs of a practical example, illustrating a difference in power supply to the heating element between when the thin-film magnetic head is placed in the state shown in FIG. 1 and when the thin-film magnetic head is flying above a rotating magnetic disk.
Figure 3B:
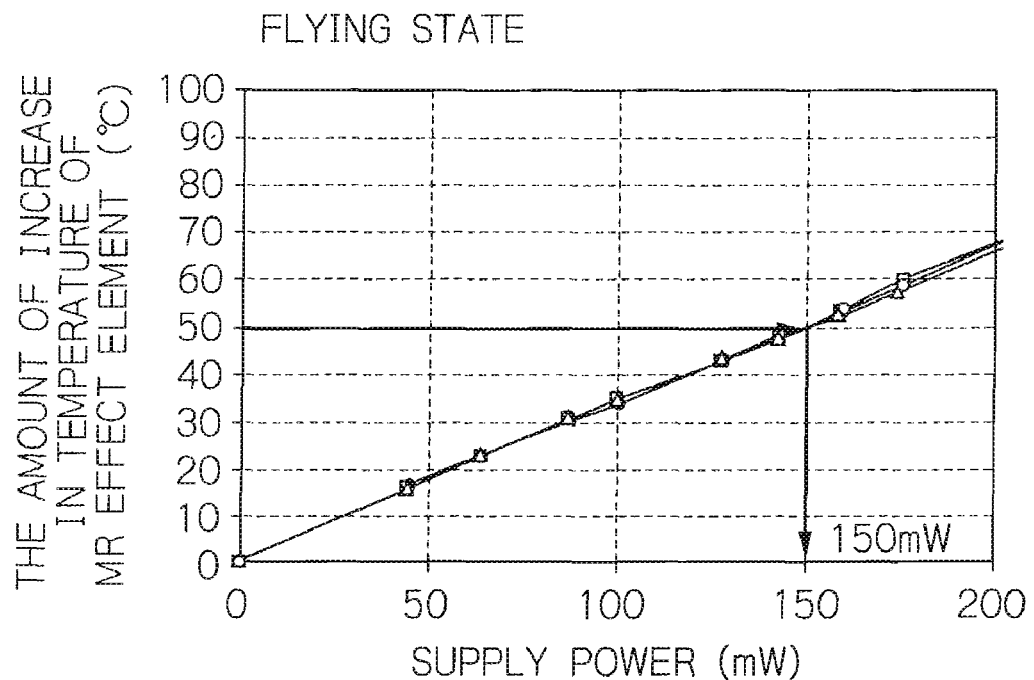
Figure 6A:
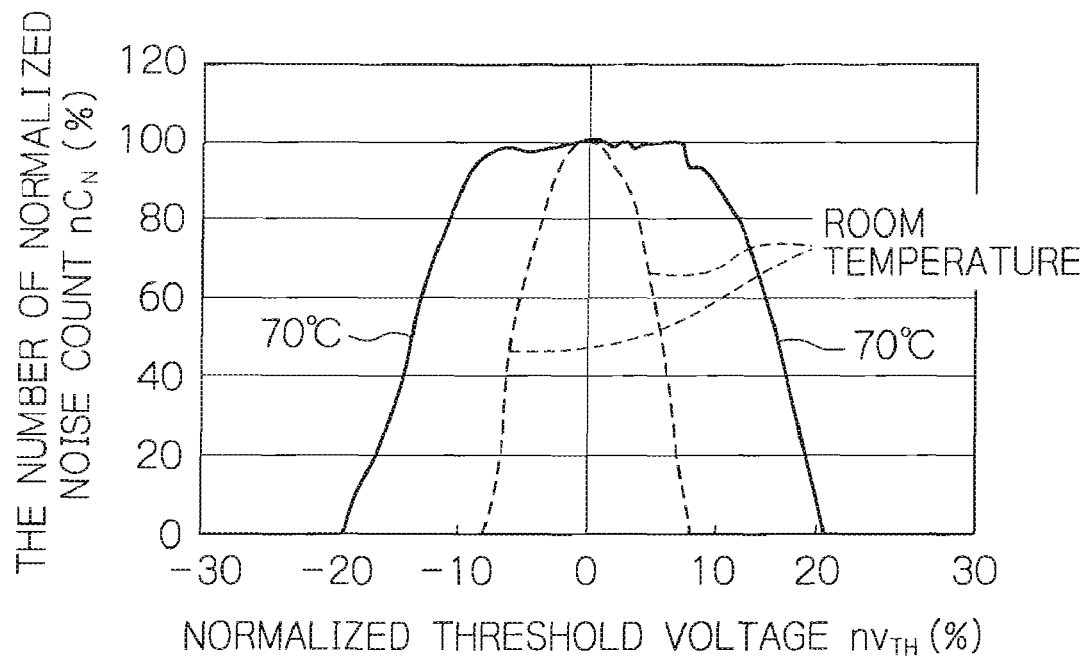
FIGS. 6a and 6b show graphs illustrating an NCP in the exemplary outputs shown in FIGS. 4a1 to 4b2.
Figure 6B:
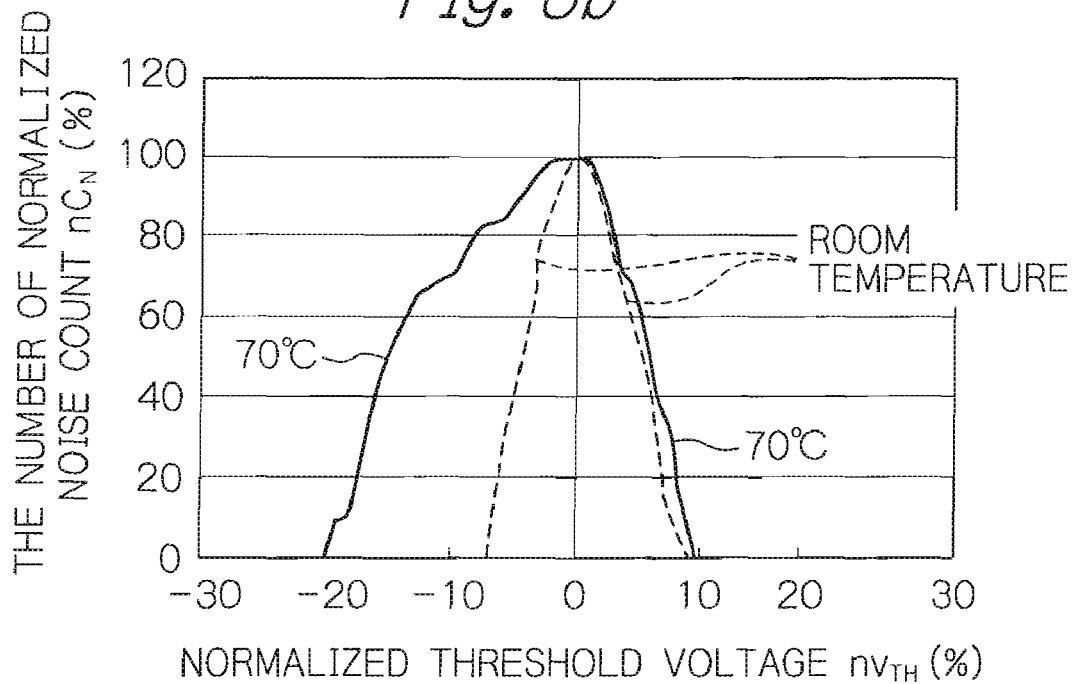

FIGS. 3a and 3b show graphs of a practical example, illustrating a difference in power supply to the heating element between when the thin-film magnetic head is placed in the state shown in FIG. 1 and when the thin-film magnetic head is flying above a rotating magnetic disk. FIGS. 4a1 to 4b2 show graphs illustrating examples of noise generated in the output from the MR effect element. FIGS. 5a to 5c show graphs for explaining a noise count profile (NCP) for evaluating the level of noise. FIGS. 6a and 6b show graphs illustrating an NCP in the exemplary outputs shown in FIGS. 4a1 to 4b2.

In the head-element testing method of the embodiment of the present invention shown in FIG. 2, the heating element first starts generating heat (step $S_f1$). In fact, the heating control circuit 501 supplies predetermined electric power to the heating element 35 through the probes 505 and the drive electrodes 38 in response to an instruction from the digital computer 500. A change in the element resistance value of the MR effect element 33 or the result of temperature detection by the temperature element 507 is used to monitor for temperature rise of the MR effect element.

In the practical example shown in FIG. 3a, when power was supplied to the heating element 35 while the thin-film magnetic head was in the state shown in FIG. 1, that is, the thin-film magnetic head was at a distance from the signal magnetic field of a magnetic disk, the amount of supplied power required for the temperature of the MR effect element 33 to rise by 50° C. was 30 mW, showing a temperature rise efficiency of 1.67° C./mW. On the other hand, while the thin-film magnetic head was flying above the rotating magnetic disk (in the normal write or read state) (FIG. 3b), the amount of supplied power required for the temperature of the MR effect element 33 to rise by 50° C. was 150 mW, showing a temperature rise efficiency of 0.33° C./mW. Therefore it can be seen that the temperature of the MR effect element 33 can be risen very efficiently by placing the thin-film magnetic head at a position distant from the signal magnetic field of the magnetic disk.

In practice, the high temperature condition with the upper limit of operating temperature used for evaluation of a thin-film magnetic head that is 70° C., for example. By placing the thin-film magnetic head at a position distant from the signal magnetic field of the magnetic disk at room temperature (20° C.), the high temperature condition can be achieved by supplying a power of approximately 30 mW. In practice, the supply power is preferably set to a value in the range from approximately 10 to 50 mW. Of course, the testing described below can be performed while the thin-film magnetic head is flying above the rotating magnetic disk.

Returning to FIG. 2, heat and stress are applied by heat generation of the heating element to the MR effect element to heat it to a predetermined high temperature (for example 70° C.) and the output from the MR effect element is measured (step $S_j2$). The measurement of the output can be started after a time required for the temperature of the MR effect element to reach a predetermine temperature, elapsed since the start of the heating by the heating element (step $S_j1$). Of course, the condition necessary to start the measurement of the output is that the MR effect element has actually reached a predetermined temperature regardless of the time during which the MR effect element is anticipated to reach a predetermined temperature. In the measurement of the output, for example, the constant current circuit 502 in FIG. 1 applies a predetermined sense current to the MR effect element 33 through the probes 506 and the signal electrodes 36 in response to an instruction from the digital computer 500, then the amplifier 503 receives the output of the MR effect element 33 through the signal electrodes 36 and the probes 506 and amplifies the output, then the A/D converter 504 converts the analog output into a digital signal, and finally the digital computer 500 takes in the digital signal.

It should be noted that a predetermined external magnetic filed may be applied to the thin-film magnetic head during measurement of the output from the MR effect element 33. In that case, for example, the magnetic field control circuit 508 may apply a predetermined current to the Helmholtz coil 509 to generate a predetermined magnetic field in response to an instruction from the digital computer 500.

In the practical example shown in FIGS. 4a1 and 4a2 (in which the MR effect element is a TMR effect element), when the temperature of the thin-film magnetic head in which noise is sufficiently minimized at room temperature (20° C.) is increased to 70° C., considerable noise occurs. The considerable noise occurs on both sides of the envelope of the output waveform in this example. However, noise can occur mainly on one side of the envelope as in the practical example in FIG. 4a2. In any case, it can be seen that when the temperature of a thin-film magnetic head in which no abnormality occurs during operation at room temperature is increased to a high temperature of 70° C., considerable problematic noise can occur.

Referring back to FIG. 2, the level of noise in the output of the MR effect element at the predetermined high temperature is measured (step $S_j3$). In practice, in the digital computer 500 that has taken in the digital signal into which the analog output from the MR effect element was converted, the digital signal is processed to obtain the level of noise. In the present embodiment, a noise count profile (NCP) is used as the indicator of the level of noise. The NCP is an enhanced representation of the level of noise in the output of the MR effect element. Specifically, the NCP is represented on a graph having a horizontal axis representing (normalized) threshold voltage and a vertical axis representing (normalized) noise count, as will be described below, and is a characteristic representation very convenient for evaluating the level of noise.

In the NCP measurement, the output from the MR effect element is first passed through a wideband amplifier to cancel a DC component and a signal with a predetermined bandwidth is extracted. FIG. 5a shows the signal represented by a graph having a horizontal axis representing time and a vertical axis representing voltage. Referring to FIG. 5a, spikes of noise protruding from a baseline having a predetermined width are shown.

A threshold voltage $v_{TH}$ for the signal shown in FIG. 5a is set and the number $C_N$ of times the signal shown in FIG. 5a crossed the threshold voltage $v_{TH}$ in a predetermined period of time $T_{MEAS}$ (for example 10 milliseconds) is counted. Then, different threshold voltages $V_{TH}$ are set and the number $C_N$ of times the signal crossed each threshold voltage $V_{TH}$ is counted. FIG. 5b is a graph, thus obtained, of threshold voltage $V_{TH}$ versus the number $C_N$ of times the signal crossed the threshold voltages $v_{TH}$. The width of the profile curve shown in FIG. 5b basically corresponds to the width of the baseline in FIG. 5a. When noise exists in the signal, the profile curve will have a skirt or shoulder.

In FIG. 5b, an order-of-magnitude increase of the number $C_N$ appears and the curve protrudes around 0 V and the presence of noise is obscured in the graph. FIG. 5c shows a graph having a vertical axis that avoids this problem. The vertical axis of the graph shown in FIG. 5c represents a normalized number of counts $nC_N$ obtained by calculating the logarithm of the value and normalizing the resulting value at 0 V as 100%, that is, $\log_{10}(C_N/\text{MAX}(C_N)) \times 100$ (%). As a result, the frequency and magnitude of popping noise are clearly represented on the graph and the noise characteristic can be readily evaluated. The characteristic shown in FIG. 5c is the NCP.

FIG. 6a shows an example of NCP measurement in the example of the output shown in FIGS. 4a1 and 4a2; FIG. 6b shows an example of NCP measurement in the example of the output shown in FIGS. 4b1 and 4b2. The horizontal axis of the graphs in FIGS. 6a and 6b represents the normalized threshold voltage $nv_{TH}$ (%) obtained by normalizing the threshold voltage $v_{TH}$ by the maximum output voltage value of the MR effect element. Referring to FIG. 6a, the profile curve has shoulders on both sides along the horizontal axis and is symmetric and wide, reflecting that many noises occurred on both sides of the envelope of the output waveform at 70° C. Referring to FIG. 6b, the profile curve has a shoulder only in one direction (in the negative direction in this figure) along the horizontal axis and is generally asymmetric, reflecting that noises occurred disproportionately on one side of the envelope of the output waveform at 70° C. Thus, it can be seen that the NCP properly reflects the level of problematic noise.

Referring back to FIG. 2, heat generation by the heating element then ends (step $S_j4$). Heating operation by the heating element can be ended at any stage after the measurement of output of the MR effect element (step $S_j2$), by taking into consideration the effect of the amount of heat generated by the heating element on a write or read operation.

Then, determination is made on the basis of the level of noise in the output of the MR effect element measured at step $S_j3$ as to whether the MR effect element (thin-film magnetic head) is non-defective (step $S_j5$). If the MR effect element (thin-film magnetic head) satisfies a criterion, the MR effect element (thin-film magnetic head) is determined as a non defective (acceptable) one (step $S_j6$). Otherwise, the MR effect element is determined as a defective one (step $S_j7$).

In practice, determination at step $S_f5$ is made by processing the level of noise obtained by the digital computer 500 shown in FIG. 1, for example. Specifically, a defective region may be provided on an NCP graph and, if the profile curve crosses the defective region (if the level of noise is so high that it crosses the region), the MR effect element (thin-film magnetic head) may be determined as a defective one.

The above-described testing method according to the flow-chart shown in FIG. 2 can be surely realized by using an appropriate computer program executed in the digital computer.

FIG. 7 shows a graph illustrating a practical example of the present invention in which a thin-film magnetic head is evaluated on the basis of an NCP.

Referring to FIG. 7, regions where the normalized noise count $nC_N$ exceeds 30% when the normalized threshold voltage $nv_{TH}$ is less than −10% or greater than 10% (that is, the absolute value of $nv_{TH}$ is greater than 10%) are considered as defective regions (the shaded rations in FIG. 7). That is, if $nC_N \leqq 30\%$ in the range $|nv_{TH}|>10\%$, the MR effect element (thin-film magnetic head) is determined as a non-defective one; if $nC_N$ exceeds 30% in the range $|nv_{TH}|>10\%$, the MR effect element (thin-film magnetic head) is determined as a defective one.

In FIG. 7, all profile curves of group 1 of thin-film magnetic head samples (the number of samples N=100) do not cross the defective regions described above. Therefore, all the thin-film magnetic heads in group 1 are determined as non-defective ones. On the other hand, all profile curves of group 2 consisting of the two thin-film magnetic heads described above and shown in FIGS. 4a1 to 4b2 and FIGS. 6a and 6b as practical examples cross the defective regions described above. Therefore, the two thin-film magnetic head in group 2 are determined as defective ones.

It should be noted that the criterion for the determination (as to whether $nC_N \leqq 30\%$ in the range $|nv_{TH}|>10\%$) described above is very effective in a real manufacturing field. That is, the profile curves of normal good thin-film magnetic heads are narrow and peak-shaped and are almost entirely within the range between the defective regions described above, like those of group 1 shown in FIG. 7. On the other hand, analysis of defective thin-film magnetic heads has shown that shoulders of the profile curves of thin-film magnetic heads with problematic noise level almost always enter the defective regions described above.

It will be understood from the foregoing that MR effect elements can be properly evaluated on the basis of read output characteristics of the MR effect elements, in particular the level of noise, under high-temperature and high-stress conditions by using the testing method according to the present invention. By the testing method, determination as to whether MR effect elements or thin-film magnetic heads are acceptable or not can be properly made and the manufacturing yield of thin-film magnetic heads, HGAs, or magnetic recording/reproducing apparatuses can be improved.

Furthermore, because the heating element provided within a thin-film magnetic head is used in the testing method according to the present invention, the temperature of the MR effect element, which is one of the important testing conditions, can be flexibly set and properly controlled by adjusting electric power supplied to the heating element.

Since defective regions on an NCP graph are used for determining the level of noise, the pass/fail criteria can be flexibly and readily set and adjusted. By using multiple defective regions, stepwise pass/fail determination can also be readily performed.

Figure 8A:
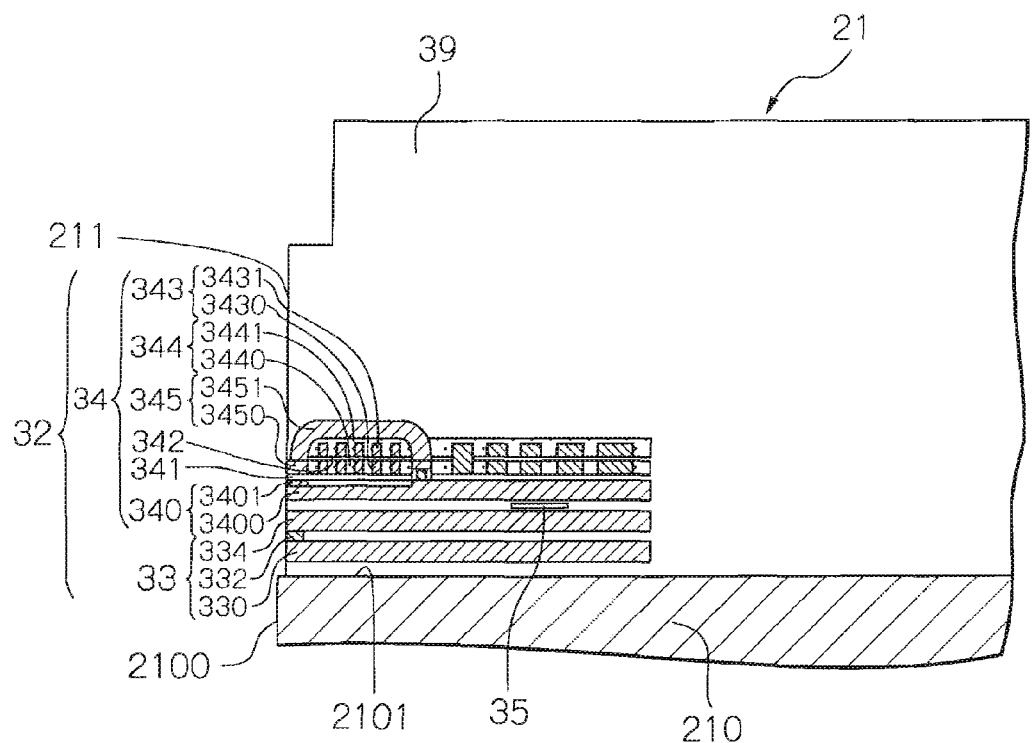
FIG. 8a shows a cross-sectional view taken along line A-A of FIG. 1 illustrating a configuration of a main portion of a thin-film magnetic head used for conducting the head-element testing method according to the present invention.

FIG. 8a shows a cross-sectional view taken along line A-A of FIG. 1 illustrating a configuration of a main portion of a thin-film magnetic head used for conducting the head-element testing method according to the present invention. FIG. 5b shows a perspective view including the A-A cross-section.

In FIG. 8a, a slider substrate 210 is made of a material such as Altic ($Al_2O_3$—TiC) and has an ABS 2100 which faces the surface of a magnetic disk. Among other elements, an MR effect element 33, an electromagnetic coil element 34, a heating element 35, and an overcoat layer 39 which covers these elements are formed on the element formation surface 2101 which is one side surface of the slider substrate 210 when the ABS 2100 is the bottom.

The MR effect element 33 includes an MR effect multilayer 332 and a lower shield layer 330 and an upper shield layer 334 which sandwich the multilayer 332. The lower shield layer 330 and the upper shield layer 334 may be formed by pattern plating, including frame plating, with a material such as NiFe (permalloy or the like), CoFeNi, CoFe, FeN, or FeZrN with a thickness in the range from approximately 0.5 to approximately 3 μm, for example.

The MR effect multilayer 332 includes a CIP-GMR multilayer film, a CPP-GMR multilayer film, or a TMR multilayer film and senses a signal magnetic field from a magnetic disk with a very high degree of sensitivity. The upper and lower shield layers 334 and 330 prevent the MR effect multilayer 332 from being affected by an external magnetic field.

If the MR element multilayer 332 includes a CIP-GMR multilayer film, an insulating upper and lower shied gap layers are provided between the MR element multilayer 332 and the upper and lower shield layers 334 and 330, respectively. And an MR lead conductor layer is further formed for supplying a sense current to the MR effect multilayer 332 and for taking a reproduction output. On the other hand, if the MR effect multilayer 332 includes a CPP-GMR multilayered film or a TMR multilayered film, the upper and lower shield layers 334 and 330 also function as upper and lower electrodes, respectively. In this case, the upper and lower shield gap layers and the MR lead conductor layer are not needed and are omitted. An insulating layer, not shown, is formed between the shield layers of the MR multilayer 332 on the side opposite to the head end surface 300. And on both sides of the MR effect multilayer 332 along the track-width direction, insulating layers may be provided, or a bias insulating layer and hard bias layers made of a ferromagnetic material may be formed for applying a longitudinal bias magnetic field for stabilizing magnetic domains.

If the MR effect multilayer 332 includes a TMR effect multilayer film, the MR effect multilayer 332 has a structure in which sequentially stacked are, for example: an antiferromagnetic layer made of a material such as IrMn, PtMn, NiMn, or RuRhMn with a thickness in the range from approximately 5 to approximately 15 nm; a pinned layer formed of a ferromagnetic material such as CoFe or of two layers made of a ferromagnetic material such as CoFe sandwiching a layer made of a non-magnetic metal such as Ru, and whose magnetization direction is fixed by the antiferromagnetic layer; a tunnel barrier layer made of a nonmagnetic dielectric material formed by oxidizing a film made of a metal such as Al, AlCu, or Mg with a thickness of approximately 0.5 to 1 nm with oxygen introduced in a vacuum system or by naturally oxidizing such a metal film; and a free layer having a two-layered structure of a film made of a ferromagnetic material such as CoFe with a thickness of approximately 1 nm and a film made of a ferromagnetic material such as NiFe with a thickness of approximately 3 to 4 nm, and coupled with the pinned layer by tunnel exchange coupling through the tunnel barrier layer.

The electromagnetic coil element 34 is desired for longitudinal magnetic recording and includes a lower magnetic pole layer 340, a write gap layer 341, a write coil layer 343, a write coil insulating layer 344, and an upper magnetic pole layer 345. The write coil layer 343 has a two-layered structure consisting of a lower write coil layer 3430 and an upper write coil layer 3431, and is formed so as to pass in its one turn at least between the lower magnetic pole layer 340 and the upper magnetic pole layer 345. The lower magnetic pole layer 340 and the upper magnetic pole layer 345 forms a guide for a magnetic flux generated by electricity applied to the write coil layer 343.

The lower magnetic pole layer 340 includes: a lower yoke layer 3400; and a lower magnetic pole portion 3401 which is formed on the end portion of the lower yoke layer 3400 on the ABS 2100 side (on the slider end surface 211 side) and reaches the slider end surface 211, and whose upper surface is in contact with the surface of the gap layer 341. The lower yoke layer 3400 is formed of a material such as NiFe, CoFeNi, CoFe, FeN, or FeZrN with a thickness within the range from approximately 0.5 to approximately 3.5 μm by using sputtering or pattern plating including frame plating, for example. The lower magnetic pole portion 3401 is formed of a material such as NiFe, CoFeNi, CoFe, FeN, or FeZrN with a thickness in the range from approximately 0.2 to approximately 0.6 μm by using sputtering, for example. The saturation magnetic flux density of the lower magnetic pole portion 3401 is set higher than that of the lower yoke layer 3400, for example at least 2.0 teslas (T).

The upper magnetic pole layer 345 includes: an upper magnetic pole portion 3450 whose lower surface is in contact with the surface of the write gap layer 341; and an upper yoke layer 3451 whose ABS 2100-side end portion is in surface contact with the upper magnetic pole portion 3450. The upper magnetic pole portion 3450 is formed of a material such as NiFe, CoFeNi, CoFe, FeN, or FeZrN with a thickness in the range from approximately 1 to approximately 3 μm by using sputtering or pattern plating including frame plating. The upper yoke layer 3451 is formed of a material such as NiFe, CoFeNi, CoFe, FeN, or FeZrN with a thickness in the range from approximately 0.5 to approximately 3.0 μm by pattern plating including frame plating, for example. The saturation flux density of the upper magnetic pole portion 3450 is higher than that of the upper yoke layer 3451, for example at least 2.0 T.

The lower magnetic pole portion 3401 and the upper magnetic pole portion 3450 sandwich the end of the write gap layer 341 on the ABS 2100 side (on the slider end surface 211 side). A leakage magnetic field from this end of the write gap layer 341 causes a writing onto the magnetic disk. Ultrathin coating of a material such as diamond-like carbon (DLC) is applied to the ends reaching the slider end surface 211 of the lower magnetic pole portion 3401 and upper magnetic pole portion 3450 on the magnetic disk side for protecting the ends.

The write coil insulating layer 344 has a two-layered structure consisting of a lower write coil insulating layer 3440 which surrounds the lower write coil layer 3430 and an upper write coil insulating layer 3441 which surrounds the upper write coil layer 3431. The write coil insulating layer 344 is provided in order to electrically insulating the write coil layer 343 from the upper and lower magnetic pole layers 345 and 340. An upper-lower coil insulating layer 342 is provided between the lower write coil layer 3430 with the lower write coil insulating layer 3440 and the upper write coil layer 3431 with the upper write coil insulating layer 3441 in order to electrically insulate between them. While the write coil layer 343 in FIGS. 8a and 8b has a two-layered structure, it may be a single layer or consist of three or more layers, or a helical coil.

The lower write coil layer 3430 and the upper write coil layer 3431 are formed of a material such as Cu with a thickness in the range from approximately 0.3 to approximately 5 μm by using frame plating, for example. The lower write coil insulating layer 3440 and the upper write coil insulating layer 3441 are resin layers formed of a resin such as heat-cured photoresist with a thickness in the range from approximately 0.5 to 7 μm by using photolithography, for example. The write gap layer 341 is an insulating layer formed of a material such as $Al_2O_3$, $SiO_2$, ALN or DLC with a thickness in the range from approximately 0.01 to approximately 0.1 μm by using sputtering or CVD, for example.

Figure 8B:
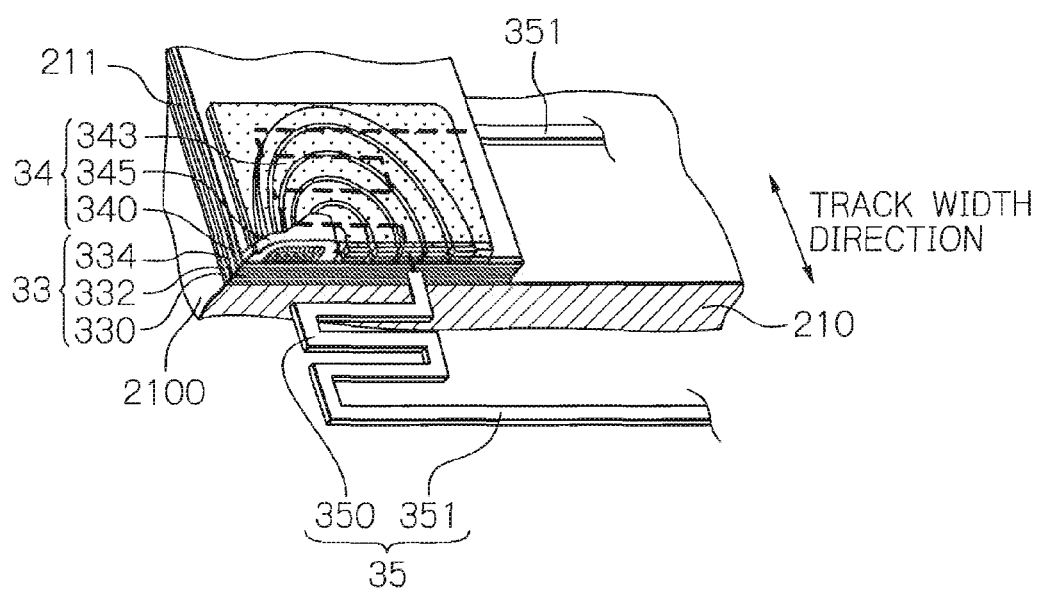

The heating element 35 is provided near the slider end surface 211 between the MR effect element 33 and the electromagnetic coil element 34 as shown in FIG. 8b (and FIG. 8a). The heating element 35 has: a heating line layer 350 which is a line meandered in one layer like a rectangular wave; and two lead line layers 351 connected to both ends of the heating line layer 350. The heating element 35 forms a current path having a given length. One end of each lead line layer 351 is connected to the drive electrode 38 (FIG. 1). The heating element 35 is supplied with electric power for heat generation by a control circuit, which will be described later, through the drive electrode 38. The shape of the heating line layer 350 is not limited to the meander shape. For example, it may be in the shape of a line, a letter U, or spiral.

The heating line layer 350 may have a thickness in the range from approximately 0.1 to 5 μm, and may be formed of a material, including NiCu, NiCr, Ta, W, Ti, Cu, Au, or NiFe. The lead line layer 351 may be made of the same material as the heating line layer 350.

Figure 9A:
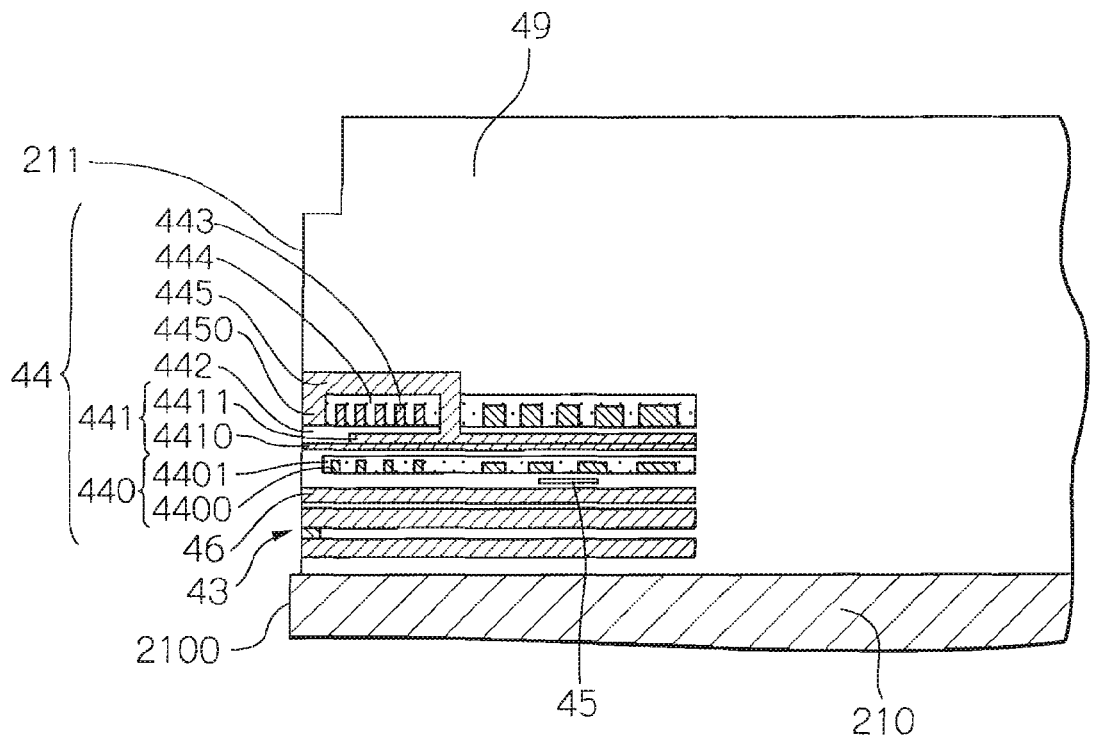
FIGS. 9a and 9b show cross-sectional views taken along line A-A of FIG. 1 illustrating a main portion of another embodiment of a thin-film magnetic head used in performing the head element testing method according to the present invention.
Figure 9B:
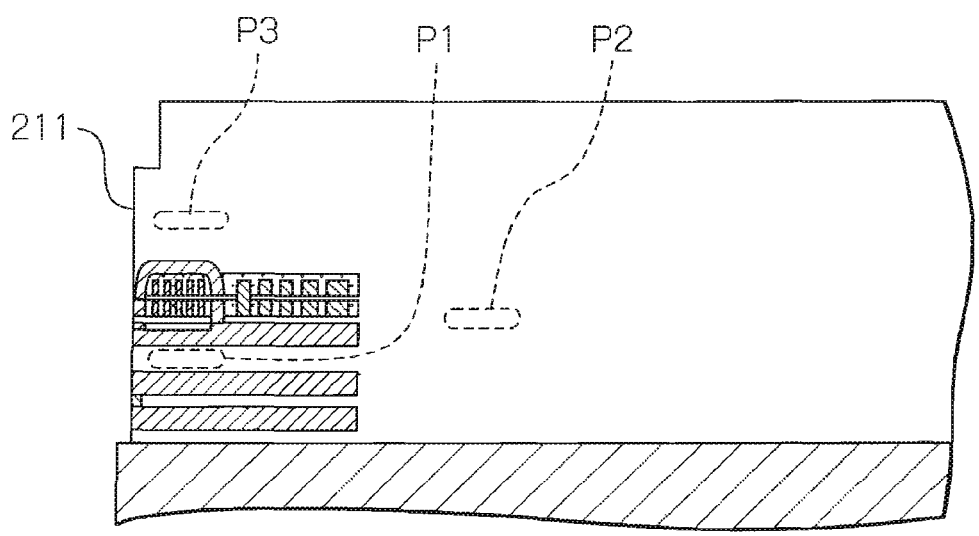

FIGS. 9a and 9b show cross-sectional views taken along line A-A of FIG. 1 illustrating a main portion of another embodiment of a thin-film magnetic head used in performing the head element testing method according to the present invention.

Referring to FIG. 9a, an electromagnetic coil element 44 is designed for perpendicular magnetic recording and includes a baking coil portion 440, a main magnetic pole layer 441, a gap layer 442, a write coil layer 443, a write coil insulating layer 444, and an auxiliary magnetic pole layer 445. Provided between the electromagnetic coil element 44 and the MR effect element 43 for reading data signals is an inter-element shield layer 46 that acts as a magnetic shield. A heating element 45, which functions as a flying-height adjusting element, is provided near the slider end surface 211 between the electromagnetic coil element 44 and the inter-element shield layer 46.

The main magnetic pole layer 441 is a magnetic flux guide for converging and guiding a magnetic flux generated by electricity applied to the write coil layer 443 to a perpendicular magnetic record layer of a magnetic disk on which data is to be written, and consists of a main magnetic pole principal layer 4411 and a main magnetic pole support layer 4410. The thickness of the end portion of main magnetic pole layer 441 on the slider end surface 211 side is equivalent to the thickness of the main magnetic pole principal layer 4411, and therefore, is small. As a result, an ultra-fine write magnetic field coping with increased recording density can be generated.

The end portion on the slider end surface 211 side of the auxiliary magnetic pole layer 445 is a trailing shield portion 4450 that has a wider cross-section than the other portions of the auxiliary magnetic pole layer 445. The trailing shield portion 4450 is opposed to the end portion on the slider end surface 211 side of the main magnetic pole layer 441 through the gap layer 442. The provision of the trailing shield portion 4450 makes the magnetic field gradient steeper between the end portion of the trailing shield portion 4450 and the end portion of the main magnetic pole layer 441. As a result, jitter of the signal output becomes smaller, and therefore, the read error rate can be reduced.

The write coil layer 443 is formed so as to pass in its one turn at least between the main magnetic pole layer 441 and the auxiliary magnetic pole layer 445. The write coil insulating layer 444, which surrounds the write coil layer 443, is provided for electrically insulating the write coil layer 443 from the main magnetic pole layer 441 and the auxiliary magnetic pole layer 445.

A backing coil portion 440 is provided in the electromagnetic coil element 44 between the inter-element shield layer 46 (heating element 45) and the main magnetic pole layer 441. The backing coil portion 440 is composed of a baking coil layer 4400 and a backing coil insulating layer 4401 and generates a magnetic flux that cancels a magnetic flux loop that is generated from the main magnetic pole layer 441 and the auxiliary magnetic pole layer 445 and passes through the upper and lower shield layers in the MR effect element 43, in order to prevent Wide Adjacent Track Erasure (WATE), which is unwanted write or erase operation on a magnetic disk.

Referring to FIG. 9b, the heating element, which is a component of the thin-film magnetic head in any of the embodiment shown in FIG. 8a and FIG. 9a, may be provided in any of positions P1 to P3. The heating element may be provided in a position (P1) near the slider end surface 211 between the MR effect element and the electromagnetic coil element, or a position (P2) in the overcoat layer opposite to the slider end surface 211 with respect to the magnetic head element, or a position (P3) in the overcoat layer near the slider end surface 211 directly above the electromagnetic coil element. If the heating element is disposed in position P1, the efficiency of temperature rise of the MR effect element with respect to supplied power will be higher than in the other positions, and therefore, the head element can be tested with lower supplied power. Further, in this case of position P1, when the heating element also functions as a flying-height adjusting element, the efficiency of protrusion of the end of the magnetic head element will be high, and the protrusion response will be fast.

A method for manufacturing a thin-film magnetic head and an HGA using a testing method according to the present invention will be described below.

Figure 10:
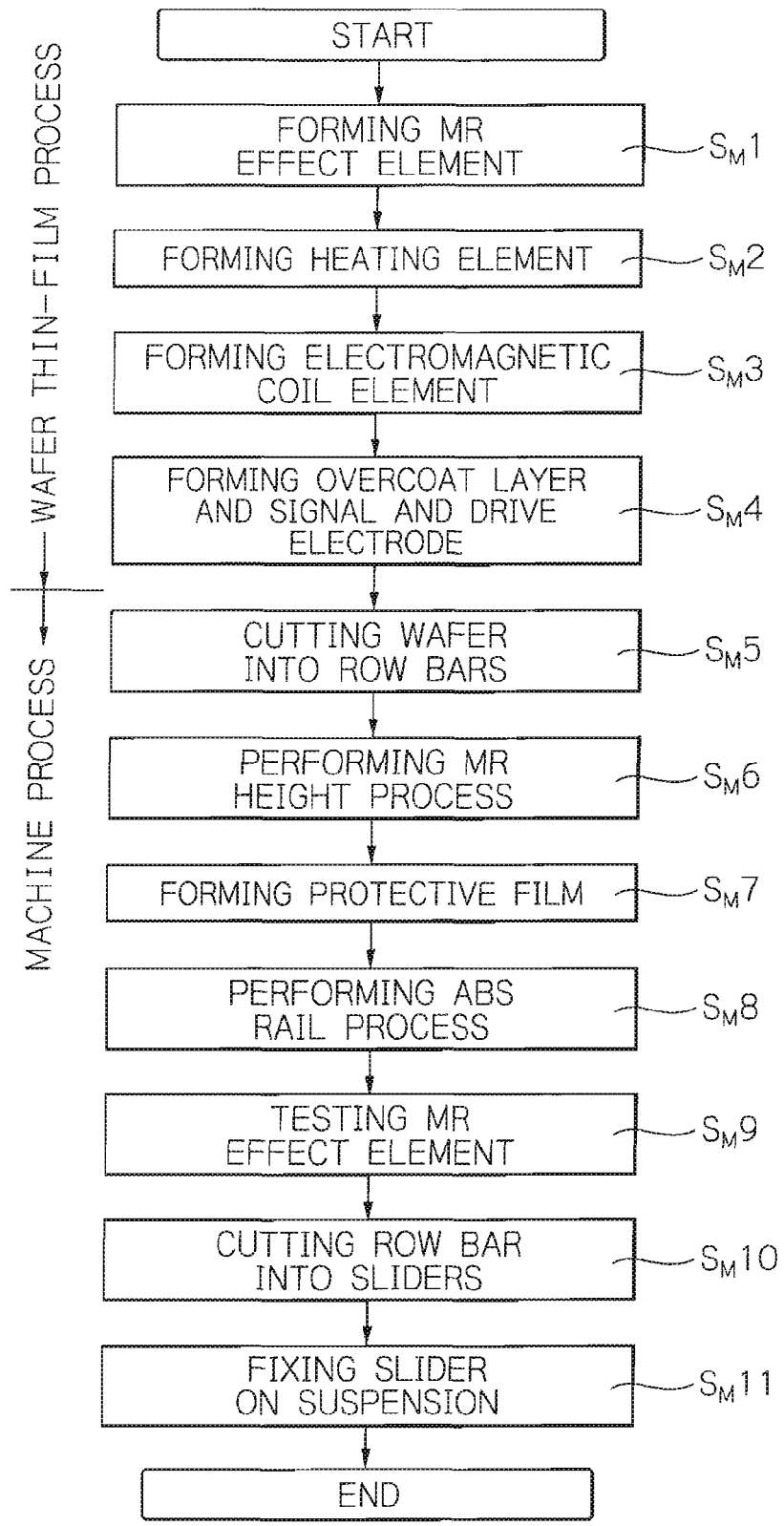
FIG. 10 shows a flowchart schematically illustrating one embodiment of the method for manufacturing the thin-film magnetic head according to the present invention.

FIG. 10 shows a flowchart schematically illustrating one embodiment of the method for manufacturing the thin-film magnetic head according to the present invention. While the manufacturing method will be described with respect to the flowchart of FIG. 10, elaboration will be provided with reference to FIGS. 11a to 11d as needed.

FIGS. 11a to 11d show schematic diagrams illustrating stages of a manufacturing process and how probes are in contact in a testing stage.

Referring to FIG. 10, an MR effect element, which acts as a read head element, is formed on the element formation surface of a substrate wafer for slider (step $S_M1$). Then, a heating element for testing of the MR effect element is formed (step $S_M2$), and an electromagnetic coil element, which acts as a write head element, is formed (step $S_M3$). Then an overcoat layer for protecting the head elements and the heating element and signal and drive electrodes electrically connected to the head elements and the heating element are formed (step $S_M4$). With this, the wafer thin-film process ends.

Figure 11A:
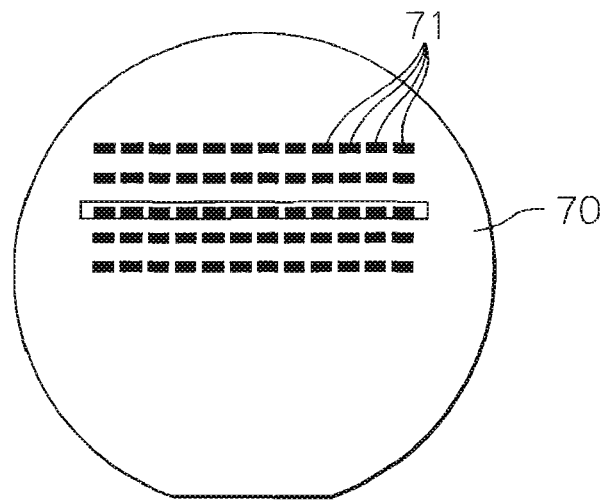
FIGS. 11a to 11d show schematic diagrams illustrating stages of a manufacturing process and how probes are in contact in a testing stage.

Referring to FIG. 11a, element patterns 71 that includes the magnetic head element 32 having the MR effect element, the heating element 35, signal electrode 36 and 37, and drive electrodes 38 are arranged in matrix on the substrate wafer 70 after a wafer thin-film process.

Referring back to FIG. 10, the wafer substrate after the wafer thin-film process is adhered to a cutting and dividing jig with an adhesive such as a resin and cut into row bars, on each of which multiple head elements and heating elements are arranged in a row (step $S_M5$). The row bar is adhered to a polishing jig with an adhesive such as a resin, and polishing is applied to the row bar as MR height processing to determine the position of the ABS and the height of the MR effect element (MR height), that is, the length in the direction perpendicular to the ABS of the MR effect element (step $S_M6$). Then, a protective film of diamond-like-carbon (DLC), for example, for protecting the end on the ABS side of the head element on the slider end surface is formed on the row bar after the MR height process (step $S_M7$). The row bar on which the protective film is formed is adhered to a rail formation jig with an adhesive such as a resin, and the process for forming a rail in the ABS is performed by using photolithography and ion beam etching (step $S_M8$).

Then, the MR effect elements on the row bar after the rail process are tested (step $S_M9$). The testing is performed by using a head-element testing method according to the present invention. For example, the embodiment shown in FIG. 2 is used.

Figure 11B:
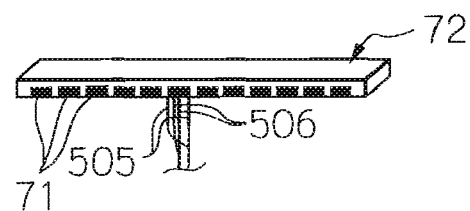

Referring to FIG. 11b, in the testing of the MR effect elements (step $S_M9$), probes 505 and probes 506 shown in FIG. 1 are brought into contact with drive electrodes 38 and signal electrodes 36, respectively, of the element patterns 71 arranged in a row on the row bar 72 after the rail process. After the testing, element patterns including MR effect elements determined as non-defective ones are selected as non-defective patterns.

Referring back to FIG. 10, the tested row bar is adhered to a cutting jig with an adhesive such as a resin, grooved, and then cut into individual sliders (step $S_M10$). With this, the machine process for forming the sliders ends, and thin-film magnetic heads (sliders) having the element pattern selected as non-defective one as a result of the testing are obtained. With this, the thin-film magnetic film manufacturing process ends.

The testing process (step $S_M9$) may be performed between the step of cutting the wafer into row bars (step $S_M5$) and the step of cutting the row bar into sliders (step $S_M10$) instead of at the step of the flowchart shown in FIG. 10. Testing can also be conducted on the wafer substrate immediately after the completion of the wafer thin-film process, that is, after the overcoat layer and signal and drive electrodes are formed (step $S_M4$).

Referring to FIG. 10, each of the thin-film magnetic heads manufactured by the manufacturing method described above is fixed on a suspension (step $S_M11$) to fabricate an HGA.

Figure 11C:
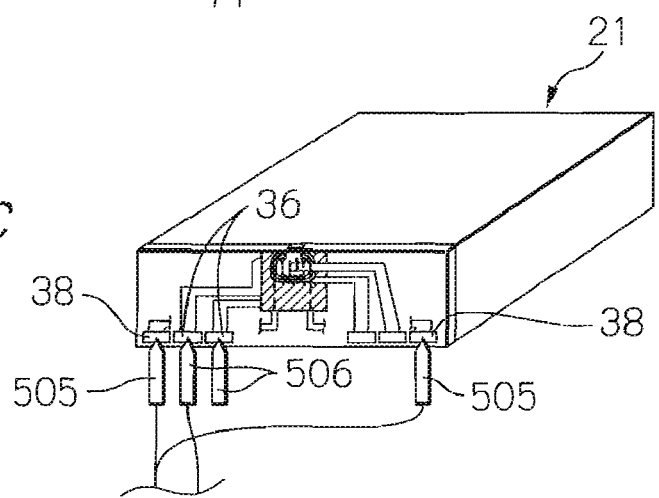

As shown in FIG. 11c, the testing process (step $S_M9$) may be performed after the row bar is cut into sliders (step $S_M10$). In that case, probes 505 and probes 506 shown in FIG. 1 are brought into contact with the drive electrodes 38 and signal electrodes 36 of each of the separated individual thin-film magnetic heads 21 to perform the testing. Then, only thin-film magnetic heads having MR effect elements determined as non-defective ones as a result of the testing are fixed to suspensions to fabricate HGAs.

Figure 11D:
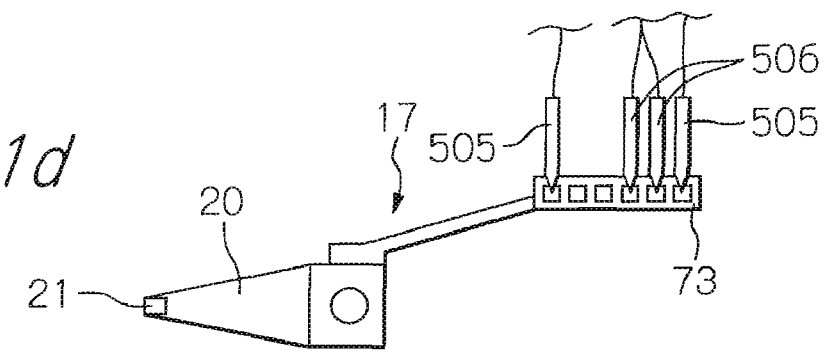

The testing process (step $S_M9$) may be performed on a manufactured HGA 17. In that case, probes 505 and probes 506 shown in FIG. 1 are appropriately brought into contact with connection pads 73 of the HGA 17 as shown in FIG. 11d to perform testing.

By the manufacturing method according to the present invention described above, the read output characteristic of an MR effect element under high-temperature and high-pressure conditions, which was very difficult to be evaluated beforehand, can be evaluated. Therefore, determination as to whether MR effect elements or thin-film magnetic heads are acceptable or not can be properly made and the manufacturing yield of thin-film magnetic heads or HGAs can be improved.

Figure 12:
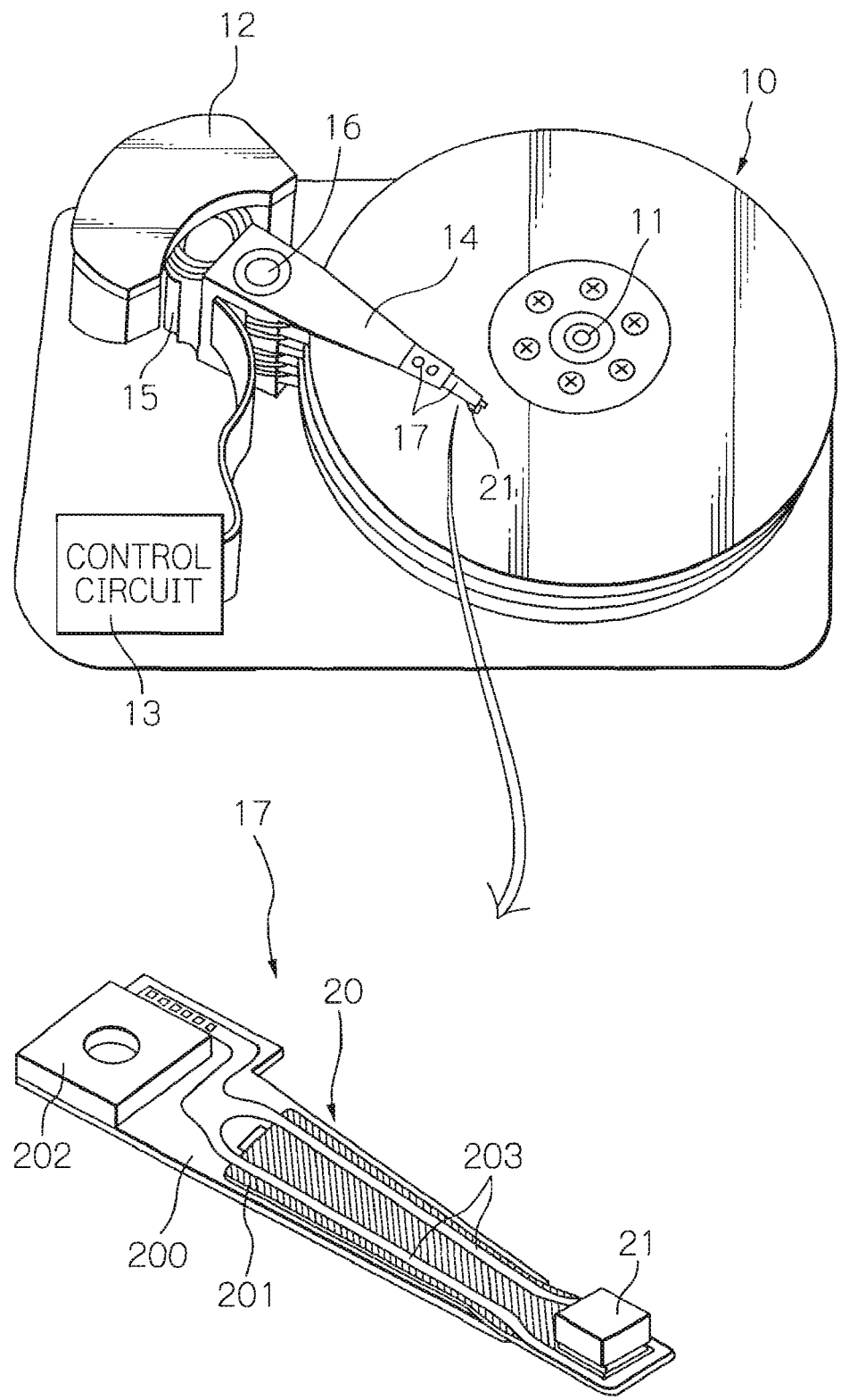
FIG. 12 shows a perspective view schematically illustrating a main part of an embodiment of the magnetic recording and reproducing apparatus according to the present invention.

FIG. 12 shows a perspective view schematically illustrating a main part of an embodiment of the magnetic recording and reproducing apparatus according to the present invention. In the perspective view of an HGA, the side of the HGA that faces the surface of a magnetic recording medium is shown facing up.

The magnetic recording and reproducing apparatus in FIG. 12 is a magnetic disk drive apparatus. Reference numeral 10 denotes magnetic disks, which are multiple magnetic record media rotating about the spindle of a spindle motor 11, reference numeral 12 denotes an assembly carriage device for positioning a thin-film magnetic head 21 above a track, and reference numeral 13 denotes a recording/reproducing and heating control circuit which controls read/write operations of the thin-film magnetic head 21 and also controls heating operation of the heating element for evaluating the condition of the thin-film magnetic head 21.

Provided in the assembly carriage device 12 are multiple drive arms 14. The drive arms 14 are capable of angular-pivoting about a pivot bearing axis 16 driven by a voice coil motor (VCM) 15 and are stacked along the axis 16. An HGA 17 is attached at the end portion of each drive arm 14. Provided on each HGA 17 is a thin-film magnetic head (slider) 21 in such a manner that it faces the surface of each magnetic disk 10. The numbers of magnetic disks 10, drive arms 14, HGAs 17, and thin-film magnetic heads 21 may be one.

Each HGA 17 is constructed by fixing and supporting a thin-film magnetic head 21 on the end portion of a suspension 20 and by connecting one end of a wiring member 203 with signal electrodes and drive electrodes of the thin-film magnetic head 21. The suspension 20 includes: a load beam 200; an flexure 201 having elasticity and fixed on and supported by the load beam 200; a base plate 202 provided on the base of the load beam 200; and a wiring member 203 which is provided on the flexure 201 and consists of lead conductors and connection pads electrically connected to the ends of the lead conductors.

It will be apparent that the structure of the suspension in the HGA 17 of the present invention is not limited to the one described above. While not shown, a head drive IC chip may be attached at some midpoint of the suspension 20.

The thin-film magnetic head 21 may be designed for longitudinal magnetic recording as shown in FIG. 8a or for perpendicular magnetic recording as shown in FIG. 9a. Depending on the recording type used, a magnetic disk 10 for longitudinal magnetic recording or perpendicular magnetic recording is used. In either case, the thin-film magnetic head 21 includes a heating element used for applying heat and stress to the MR effect element to evaluate the condition of the thin-film magnetic head 21. The heating element may also function as a flying-height adjusting element for adjusting the flying height of the thin-film magnetic head 21 from the magnetic disk 10.

Figure 13:
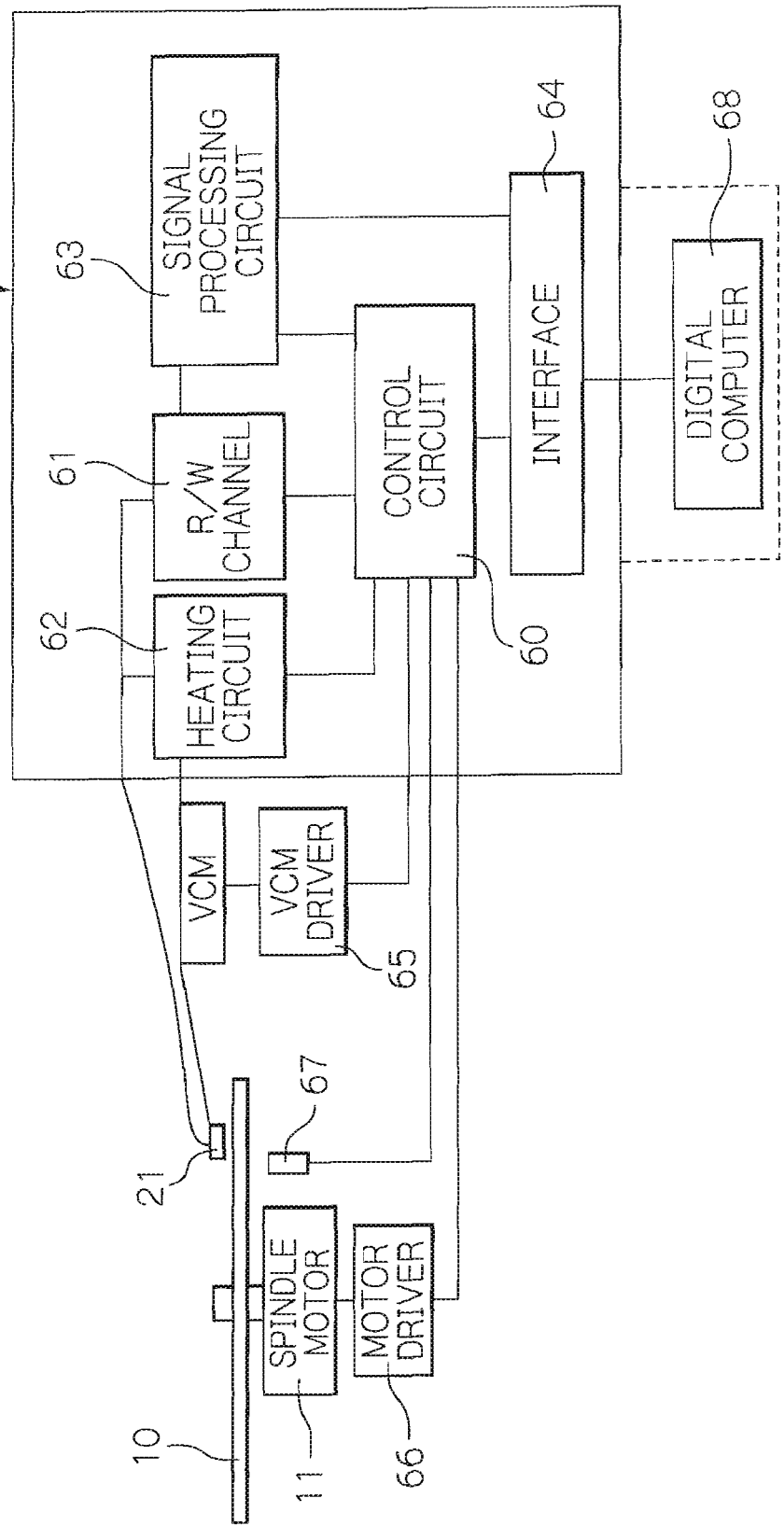
FIG. 13 shows a block diagram illustrating a configuration of the recording/reproduction and heating control circuit 13 provided in the magnetic disk drive apparatus shown in FIG. 12.

FIG. 13 shows a block diagram illustrating a configuration of the recording/reproduction and heating control circuit 13 provided in the magnetic disk drive apparatus shown in FIG. 12.

In FIG. 13, reference numeral 61 denotes an R/W (read/write) channel, reference numeral 62 denotes a heating circuit, which is a heating-element control means for supplying electric power to the heating element to control the amount of heat and the intensity of stress applied to the MR effect element, reference numeral 63 denotes a signal processing circuit which is an error/noise measuring means for measuring the rate of error or noise in the output from the MR effect element, reference numeral 60 denotes a control circuit which is a control means for controlling and causing the heating circuit 62 and the signal processing circuit 63 to operate in conjunction with each other in order to measure the rate of error or noise occurring in the output from the IR effect element under predetermined heat and stress applied by the heating element, reference numeral 64 denotes an interface, reference numeral 65 denotes a VCM driver for driving a VCM 15, reference numeral 66 denotes a motor driver for driving a spindle motor 11, reference numeral 67 denotes a temperature measurement element, and reference numeral 68 denotes a digital computer, which is a head evaluating means for evaluating the condition of the thin-film magnetic head 21 on the basis of the error rate or noise measured by the signal processing circuit 63.

The recording/reproducing and heating control circuit 13 is composed of the control circuit 60, the R/W channel 61, the heating circuit 62, the signal processing circuit 63, and the interface 64. However, the digital computer 68 may also be included in the recording/reproduction and heating control circuit 13.

In recording/reproducing operation, a recording data signal from the R/W channel 61 under the control of the control circuit 60 is sent to an electromagnetic coil element in the thin-film magnetic head 21. Then, the thin-film magnetic head 21 writes the data signal on the magnetic disk 10 being rotated by the spindle motor 11 driven by the motor driver 66. A reproduction data signal read by the MR effect element in the thin-film magnetic head 21 from the rotating magnetic disk 10 is received by the R/W channel 61 under the control of the control circuit 60. The read/write positions are controlled by driving the VCM 15 through the VCM driver 65 under the control of the control circuit 60 as appropriate.

In operation for evaluating the head, a heating current is provided from the heating circuit 62 under the control of the control circuit 60 to the heating element in the thin-film magnetic head 21. As will be described later, the value of the heating current may be gradually increased until the error rate exceeds a predetermined threshold, or may be controlled with reference to the temperature measured by the temperature measurement element 67 so that the temperature of the MR effect element reaches a predetermined value (for example 70° C.). The heating current may be a direct current, alternating current, or a pulse current.

When the temperature of the MR effect element reaches the predetermined value, the read operation described above is started. Any track on the magnetic disk 10 on which the data signal is written can be read, however, a special track for head evaluation in which predetermined data signals are written may be provided and used. Furthermore, the read operation may be performed while the thin-film magnetic head 21 is being retracted to a predetermined position distant from the signal magnetic fields of the magnetic disk 10. In that case, a predetermined external magnetic field may be applied to the thin-film magnetic head 21 using a permanent magnet or the like. When the thin-film magnetic head 21 is retracted to the predetermined position distant from the signal magnetic fields of the magnetic disk 10, the temperature of the MR effect element can be increased to a predetermined value (for example 70° C.) with lower electric power supplied to the heating element than when the thin-film magnetic head 21 is flying over the magnetic disk 10. In practice, the supplied power is in the range from approximately 10 to 50 mW.

Then, a read output signal from the MR effect element at the predetermined temperature is sent to the signal processing circuit 63 through the R/W channel 61. The control circuit 60 causes the heating circuit 62, the R/W channel 61, and the signal processing circuit 63 to operate in conjunction with each other to properly control the series of operations described above.

The signal processing circuit 63 processes the received read output signal to measure the bite error rate (BER). The measured BER is provided to the digital computer 68 through the interface 64. The digital computer 68 evaluates the condition of the thin-film magnetic head on the basis of the BER.

The signal processing circuit 63 may evaluate the condition of the thin-film magnetic head based on the measured BER. In this case, the digital computer 68 does not need to be provided within the recording/reproducing and heating control circuit 13.

The signal processing circuit 63 or the digital computer 68 may process the received read output signal to generate an NCP described earlier, set defective regions as shown in FIG. 7 for example, and evaluate the condition of the thin-film magnetic head. Multiple regions may be provided stepwise so that the condition of the thin-film magnetic heads can be evaluated on a scale of multiple levels.

Furthermore, the signal processing circuit 63 or the digital computer 68 may include a head condition indicating section, which is a head-condition indicating means for indicating the condition of the evaluated or determined thin-film magnetic head. For example, the head-condition indicating section may display an alarm or alarms at different levels on a monitor of a computer in which the magnetic disk drive apparatus is provided.

Figure 14:
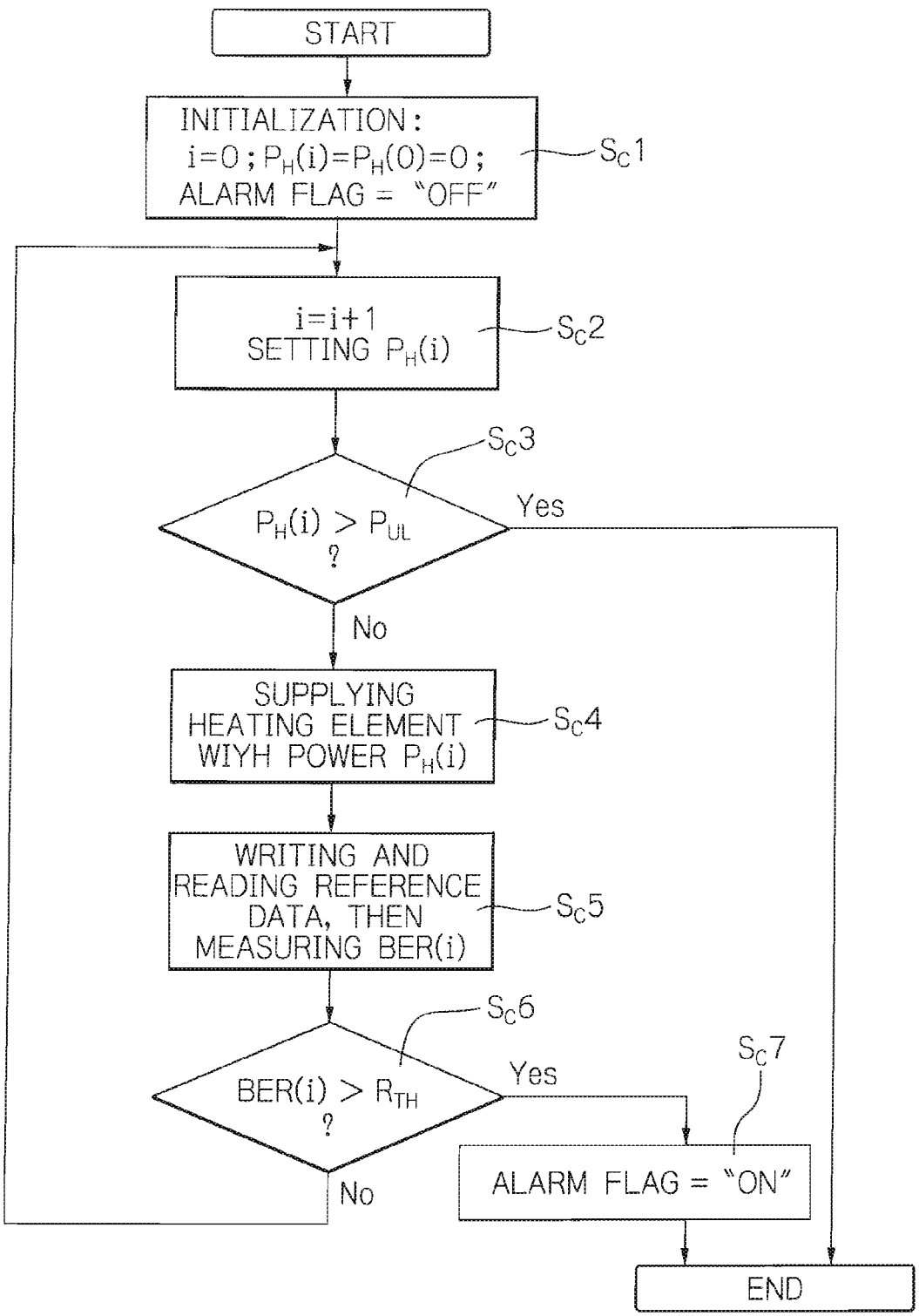
FIG. 14 shows a flowchart illustrating an embodiment of a method for evaluating a head of a magnetic recording and reproducing apparatus according to the present invention.

FIG. 14 shows a flowchart illustrating an embodiment of a method for evaluating a head of a magnetic recording and reproducing apparatus according to the present invention.

First, as initialization operation, a parameter i and the value of power $P_H(i)$ to be supplied to the heating element are set to i=0 and $P_H(i)=P_H(0)=0$, respectively, in a program executed on the digital computer, and an alarm flag is set to OFF (step $S_C1$). Then, the value of $P_H(i)$ is set to i=i+1 (step $S_C2$). The value $P_H(i)$ here is appropriately set in the program on the digital computer by taking into consideration a rise in the temperature of the MR effect element caused by heat generation by the heating element.

Then, determination is made as to whether $P_H(i)$ is greater than a predetermined threshold $P_{UL}$ (step $S_C3$). The threshold $P_{UL}$ is appropriately set by taking into consideration the upper limit of rise in the temperature of the MR effect element caused by heat generation by the heating element. For example, the threshold $P_{UL}$ may be in the range between 50 and 150 mW while the head is flying and may be in the range between 10 and 50 mW while the head is retracted. Unless $P_H(i)$ is greater than the threshold $P_{UL}$, the process proceeds to the next step. Then, power equal to the power value $P_H(i)$ is supplied to the heating element (step $S_C4$). As a result, the temperature of the MR effect element increases to a predetermined value. The electromagnetic coil element in the thin-film magnetic head is used to write reference data on a predetermined track. Then, the MR effect element is used to read the data and the bite error rate BER (i) in the output obtained when supplying the power value $P_H$ (i) is measured by the signal processing circuit (step $S_C5$).

Determination is made as to whether BER (i) is greater than a predetermined threshold $R_{TH}$ (step $S_C6$). The threshold $R_{TH}$ may be set in the program on the digital computer on the basis of a requirement for BER by taking into consideration the specifications and performance of the magnetic recording and reproducing apparatus to be evaluated, or may be set in the program on the digital computer so that the threshold $R_{TH}$ is representative of a condition of the head for stepwise head-condition determination on a scale of multiple levels. For example, the threshold may be in the range between $1\times10^{-6}$ and $1\times10^{-5}$. If it is determined that BER (i) is greater than the threshold $R_{TH}$, the alarm flag is set to ON (step $S_C7$). In response to this, the head-condition indicating section, which is a head-condition indicating means, may indicate that the head is in a defective condition corresponding to the threshold $R_{TH}$. When the alarm flag turns ON, the evaluation of the head will end.

If it is determined that BER (i) is less than or equal to the threshold $R_{TH}$, the process returns to step $S_C2$, where i is incremented by 1, and then the steps described above are repeated. If it is determined at step $S_C3$ that $P_H$ (i) is greater than the threshold $P_{UL}$, the evaluation of the head will end.

In the magnetic recording and reproducing apparatus according to the present invention, testing of the thin-film magnetic head having an MR effect element under high-temperature and high-stress conditions, which was very difficult in the past, can be conducted as appropriate. As a result, an abnormality in the magnetic recording and reproducing apparatus can be predicted.

The above-described evaluating method according to the flowchart shown in FIG. 14 can be surely realized by using an appropriate computer program executed in the digital computer.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A testing method for testing and evaluating a magnetoresistive effect element, performed on a thin-film magnetic head including the magnetoresistive effect element and a heating element provided independently of the magnetoresistive effect element, the heating element capable of applying a heat and stress to the magnetoresistive effect element, or performed on a row bar or a substrate wafer on which a plurality of the magnetoresistive effect elements and a plurality of the heating elements are disposed, comprising the steps of:

causing the heating element to generate heat to apply a heat and stress to the magnetoresistive effect element independent of heat and stress resulting from a current applied to the magnetoresistive effect element; and measuring a characteristic of the magnetoresistive effect element under the heat and stress to evaluate the magnetoresistive effect element.

2. The testing method as claimed in claim 1, wherein the magnetoresistive effect element is evaluated by causing the heating element to generate heat to apply the heat and stress to the magnetoresistive effect element and by measuring an error rate or a level of noise in an output of the magnetoresistive effect element under the heat and stress.

3. The testing method as claimed in claim 2, wherein when a count of noise that is measured in an output of the magnetoresistive effect element and has a voltage exceeding a predetermined threshold exceeds a predetermined threshold, the magnetoresistive effect element is determined as a defective one.

4. A testing method for testing and evaluating a magnetoresistive effect element, performed on a thin-film magnetic head including the magnetoresistive effect element for reading data signals from a magnetic recording medium and a heating element capable of applying a heat and stress to the magnetoresistive effect element, or performed on a row bar or a substrate wafer on which a plurality of the magnetoresistive effect elements and a plurality of the heating elements are disposed, comprising the steps of:
 causing the heating element to generate heat to apply a heat and stress to the magnetoresistive effect element;
 measuring a count of noise in an output of the magnetoresistive effect element under the heat and stress, the noise having a voltage exceeding a threshold voltage, the measuring step being repeated under various threshold voltages;
 obtaining a noise count profile of the output of the magnetoresistive effect element, the noise count profile representing a relation between a normalized value $nC_N$ of the noise count and a normalized value $nv_{TH}$ of the threshold voltage; and
 determining the magnetoresistive effect element as a defective one when the normalized noise count value $nC_N$ exceeds 30% while an absolute value of the normalized threshold value $nv_{TH}$ exceeds 10% in the noise count profile.

5. The testing method as claimed in claim 1, wherein the evaluation is performed on the thin-film magnetic head independently or incorporated in a head gimbal assembly, under the condition that the thin-film magnetic head is positioned at a distance from a signal magnetic field of a magnetic recording medium.

6. The testing method as claimed in claim 5, wherein the evaluation is performed while an external magnetic field is being applied to the thin-film magnetic head.

7. A testing method for testing and evaluating a head element, performed on a thin-film magnetic head including the head element and a heating element capable of applying a heat and stress to the head element, or performed on a row bar or a substrate wafer on which a plurality of the head elements and a plurality of the heating elements are disposed, the heading element functioning as a flying-height adjusting element as well for adjusting the flying height of the thin-film magnetic head by causing an end on an air bearing surface side of the head element to protrude due to thermal expansion, the testing method comprising the steps of:
 causing the heating element to generate heat to apply a heat and stress to the head element; and
 measuring a characteristic of the head element under the heat and stress to evaluate the head element.

8. A non-transitory computer readable medium storing a computer readable program executable by a computer for causing the computer to perform a process for testing and evaluating a magnetoresistive effect element, performed on a thin-film magnetic head including the magnetoresistive effect element and a heating element provided independently of the magnetoresistive effect element, the heating element capable of applying a heat and stress to the magnetoresistive effect element, or performed on a row bar or a substrate wafer on which a plurality of the magnetoresistive effect elements and a plurality of the heating elements are disposed, the process comprising:
 causing the heating element to generate heat to apply a heat and stress to the magnetoresistive effect element independent of heat and stress resulting from a current applied to the magnetoresistive effect element; and
 measuring a characteristic of the magnetoresistive effect element under the heat and stress to evaluate the magnetoresistive effect element.

9. A non-transitory computer readable medium storing a computer readable program executable by a computer for causing the computer to perform a process for testing and evaluating a magnetoresistive effect element, performed on a thin-film magnetic head including the magnetoresistive effect element for reading data signals from a magnetic recording medium and a heating element capable of applying a heat and stress to the magnetoresistive effect element, or performed on a row bar or a substrate wafer on which a plurality of the magnetoresistive effect elements and a plurality of the heating elements are disposed, the process comprising:
 causing the heating element to generate heat to apply a heat and stress to the magnetoresistive effect element;
 measuring a count of noise in an output of the magnetoresistive effect element under the heat and stress, the noise having a voltage exceeding a threshold voltage, the measuring step being repeated under various threshold voltages;
 obtaining a noise count profile of the output of the magnetoresistive effect element, the noise count profile representing a relation between a normalized value $nC_N$ of the noise count and a normalized value $nv_{TH}$ of the threshold voltage; and
 determining the magnetoresistive effect element as a defective one when the normalized noise count value $nC_N$ exceeds a predetermined noise-count percent while an absolute value of the normalized threshold voltage value $nv_{TH}$ exceeds a predetermined threshold-voltage percent in the noise count profile.

10. The non-transitory computer readable medium as claimed in claim 9, wherein the predetermined noise-count percent is 30%, and the predetermined threshold-voltage percent is 10%.

11. A testing method for testing and evaluating a magnetoresistive effect element, performed on a thin-film magnetic head including the magnetoresistive effect element for reading data signals from a magnetic recording medium and a heating element capable of applying a heat and stress to the magnetoresistive effect element, or performed on a row bar or a substrate wafer on which a plurality of the magnetoresistive effect elements and a plurality of the heating elements are disposed, comprising the steps of:
 causing the heating element to generate heat to apply a heat and stress to the magnetoresistive effect element;
 measuring a count of noise in an output of the magnetoresistive effect element under the heat and stress, the noise having a voltage exceeding a threshold voltage, the measuring step being repeated under various threshold voltages;
 obtaining a noise count profile of the output of the magnetoresistive effect element, the noise count profile representing a relation between a normalized value $nC_N$, of the noise count and a normalized value $nv_{TH}$ of the threshold voltage; and
 determining the magnetoresistive effect element as a defective one when the normalized noise count value $nC_N s$, exceeds a predetermined noise-count percent while an absolute value of the normalized threshold value $nv_{TH}$ exceeds a predetermined threshold-voltage percent in the noise count profile.

* * * * *